(12) United States Patent
Loghin et al.

(10) Patent No.: US 11,218,171 B2
(45) Date of Patent: Jan. 4, 2022

(54) SHORTENED LDPC CODES WITH REPETITION OF CODE BITS FOR LOW THROUGHPUT NETWORKS

(71) Applicant: Sony Semiconductor Solutions Corporation, Kanagawa (JP)

(72) Inventors: Nabil Sven Loghin, Stuttgart (DE); Reka Inovan, Stuttgart (DE)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/603,244

(22) PCT Filed: Apr. 12, 2018

(86) PCT No.: PCT/EP2018/059456
§ 371 (c)(1),
(2) Date: Oct. 7, 2019

(87) PCT Pub. No.: WO2018/189332
PCT Pub. Date: Oct. 18, 2018

(65) Prior Publication Data
US 2021/0083689 A1  Mar. 18, 2021

(30) Foreign Application Priority Data
Apr. 12, 2017 (EP) .................................... 17166329

(51) Int. Cl.
*H03M 13/11* (2006.01)
*H03M 13/00* (2006.01)
*H03M 13/29* (2006.01)

(52) U.S. Cl.
CPC .... *H03M 13/1185* (2013.01); *H03M 13/1105* (2013.01); *H03M 13/2906* (2013.01); *H03M 13/618* (2013.01); *H03M 13/6356* (2013.01)

(58) Field of Classification Search
None
See application file for complete search history.

(56) References Cited

U.S. PATENT DOCUMENTS

| 8,239,738 B2 * | 8/2012 | Brown ................ H04L 67/1097 714/776 |
| 9,356,730 B2 * | 5/2016 | Cheng ................... H04L 1/0084 |
| 2002/0124224 A1 | 9/2002 | Blankenship et al. |
| 2011/0085609 A1 | 4/2011 | Kasher |

OTHER PUBLICATIONS

International Search Report and Written Opinion dated Jun. 7, 2018 for PCT/EP2018/059456 filed on Apr. 12, 2018, 14 pages.
"920MHz-Band Telemeter, Telecontrol And Data Transmission Radio Equipment", ARIB STD-T108 Version 1.0, Association of Radio Industries and Businesses, Feb. 14, 2012, 83 pages.

(Continued)

*Primary Examiner* — Phung M Chung
(74) *Attorney, Agent, or Firm* — Xsensus LLP

(57) ABSTRACT

A transmission apparatus including a FEC encoder configured to obtain payload data structured as information words each having a predetermined first number of information bits and to encode information words having a second number of information bits into FEC code words each having a predetermined code word length.

20 Claims, 14 Drawing Sheets

(56) References Cited

OTHER PUBLICATIONS

Samsung, "Discussion on Rate Matching for LDPC codes", 3GPP TSG RAN WG1 NR Ad-Hoc Meeting, R1-1700977, Spokane, USA, retrieved at URL<http://www.3gpp.org/ftp/Meetings 3GPP_SYNC/RAN1/Docs/>, retrieved on Jan. 16, 2017, 8 pages.

ETSI, "Low Throughput Networks (LTN); Use Cases for Low Throughput Networks Disclaimer", ETSI GS LTN 001 V1.1.1, Sep. 2014, pp. 1-19.

ETSI, "Low Throughput Networks (LTN); Functional Architecture", ETSI GS LTN 002 V1.1.1, Sep. 2014, pp. 1-20.

ETSI, "Low Throughput Networks (LTN); Protocols and Interfaces", ETSI GS LTN 003 V1.1.1, Sep. 2014, pp. 1-24.

\* cited by examiner

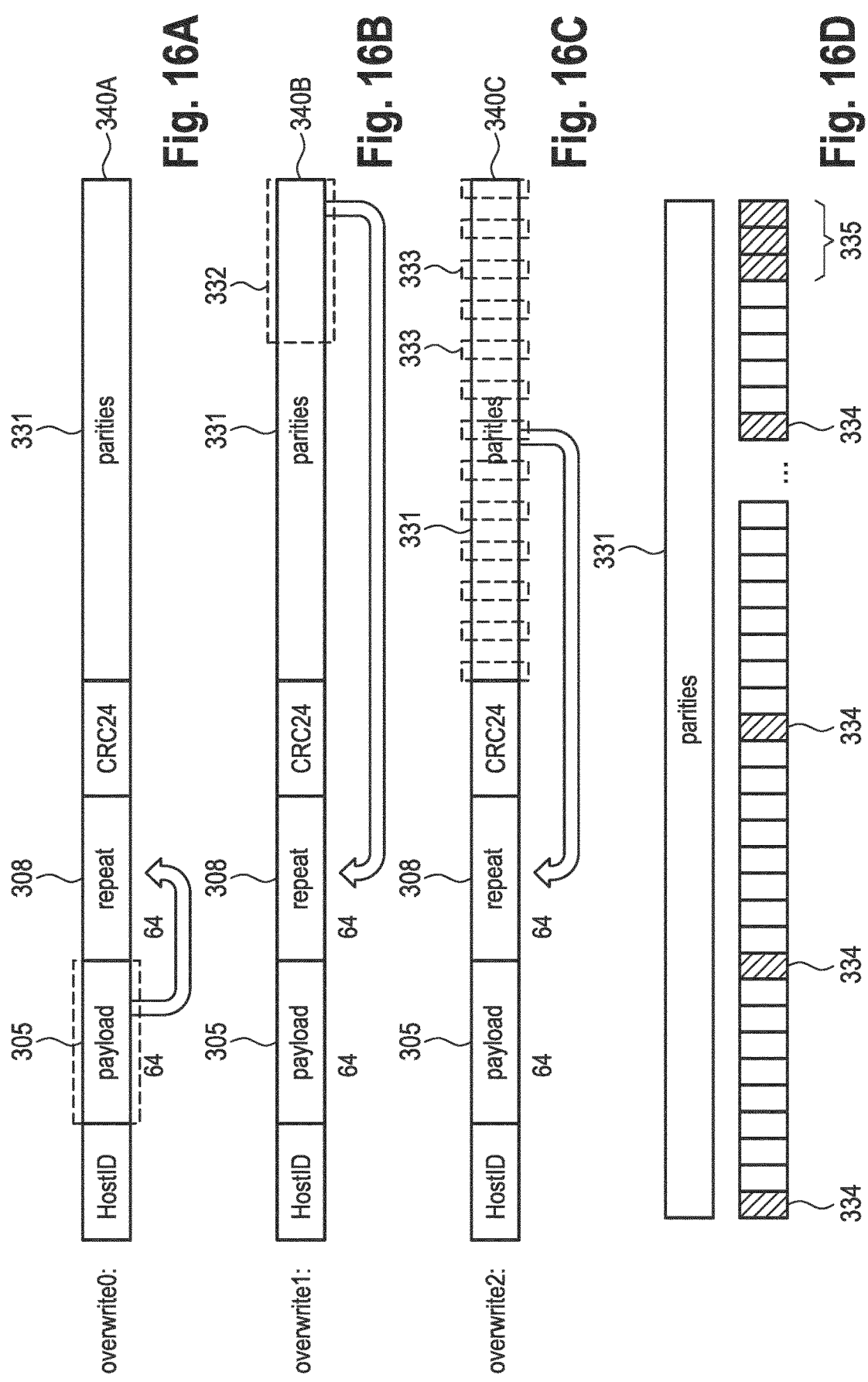

SHORTENED LDPC CODES WITH REPETITION OF CODE BITS FOR LOW THROUGHPUT NETWORKS

CROSS-REFERENCE TO RELATED APPLICATIONS

The present application is based on PCT filing PCT/EP2018/059456, filed Apr. 12, 2018, and claims priority to EP 17166329.7, filed Apr. 12, 2017, the entire contents of each are incorporated herein by reference.

BACKGROUND

Field of the Disclosure

The present disclosure relates to a transmission apparatus and a corresponding transmission method, in particular for use in a Low Throughput Network (LTN) for Internet of Things (IoT) applications or for use in a similar network. The present disclosure relates further to a receiving apparatus and a corresponding receiving method, in particular for use in an LTN.

Description of Related Art

ETSI's standardization group dedicated to LTN technology recently released the first specifications (including GS LTN 001 containing the use cases, GS LTN 002 describing the functional architecture and GS LTN 003 defining the protocols and interfaces) of an IoT network dedicated to low throughput communications. LTN technology is a wide area unidirectional or bidirectional wireless network with key differentiators compared to existing networks. It enables long-range data transmission (distances around 40 km in open field) and/or communication with buried underground equipment and operates with minimal power consumption allowing several years of operation even with standard batteries. This technology also implements advanced signal processing that provides effective protection against interference.

As a consequence, LTN is particularly well suited for low throughput machine to machine communication where data volume is limited and low latency is not a strong requirement. Applications include remote measurement, smart metering for water, gas or electricity distribution, positioning or smart cities applications such as air pollution monitoring or public lighting. LTN could also cooperate with cellular networks to address use cases where redundancy, complementary or alternative connectivity is needed.

LTN IoT networks have a similar topology to existing networks used for high data rates and dynamically adapt power and frequency in the same way, but will also manage new requirements concerning power consumption and the number of base stations required to cover an entire country. Low power, very low throughput, long battery life, simple, effective and robust radio communication principles are the key features of the first ETSI LTN specifications.

There is a need for defining an efficient transmission stream and its construction for use in an LTN.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admit-ted as prior art against the present disclosure.

SUMMARY

It is an object to provide a transmission apparatus and a corresponding transmission method, in particular for use in an LTN, for constructing an efficient transmission stream. It is a further object to provide a corresponding receiving apparatus and a corresponding receiving method, in particular for use in an LTN, as well as a corresponding computer program for implementing said methods and a non-transitory computer-readable recording medium for implementing said methods.

According to an aspect there is provided a transmission apparatus, in particular for use in an LTN, comprising:
  an FEC encoder configured to obtain payload data structured as information words each having a first number of information bits and to encode information words having a predetermined second number of information bits into FEC code words each having a predetermined code word length, wherein the FEC encoder is configured, if the first number is smaller than the second number,
  to form a filled-up information word by padding the first number of information bits of an information word with a third number of predetermined dummy bits so that the filled-up information word has said second number of bits,
  to encode said filled-up information word into an FEC code word comprising said filled-up information word and a parity portion, and
  to form a final FEC code word by replacing the dummy bits of the filled-up information word within the FEC code word by information bits and/or parity bits of said FEC code word, a frame forming section configured to form frames from said final FEC code words.

According to a further aspect there is provided a receiving apparatus, in particular for use in an LTN, comprising
  a frame extraction section configured to extract one or more frames from a received transmission stream, said frame being formed from a final FEC code word, and
  an FEC decoder configured to decode payload data from the final FEC code word, said payload data being structured as information words each having a first number of information bits, and to decode FEC code words each having a predetermined code word length into information words having a predetermined second number of information bits, wherein the FEC decoder is configured, if the first number of information bits is smaller than the second number of information bits,
  to extract additional information bits and/or parity bits from a final FEC code word, wherein a final FEC code word comprises an information word and a parity portion, the information word comprising a first number of information bits and, if said first number is smaller than the second number of information bits, additional information bits and/or parity bits,
  to combine the additional information bits and/or parity bits with corresponding bits from the FEC code word,
  to form a filled-up information word by padding the first number of information bits of the information word of the final FEC code word with a third number of predetermined dummy bits so that the filled-up information word has said second number of bits, and— to decode the payload data from the filled-up information word, the parity portion of the final FEC code word and the extracted additional information bits and/or parity bits.

According to still further aspects a computer program comprising program means for causing a computer to carry out the steps of the method disclosed herein, when said computer program is carried out on a computer, as well as a non-transitory computer-readable recording medium that stores therein a computer program product, which, when executed by a processor, causes the method disclosed herein to be performed are provided.

Embodiments are defined in the dependent claims. It shall be understood that the disclosed methods, the disclosed computer program and the disclosed computer-readable recording medium have similar and/or identical further embodiments as the claimed apparatus and as defined in the dependent claims and/or disclosed herein.

One of the aspects of the disclosure is to propose an efficient frame building for use in an LTN, by which particularly an improved decoding can be achieved and the error rate can be improved. If the payload size, in particular the number of information bits, is smaller than a predetermined default, which contradicts the predetermined (fixed) length of an information word for use in block coding and thus of an FEC code word, it is proposed to fill the remaining part of the information word with dummy data, in particular dummy zeros, and to overwrite, after FEC encoding, the dummy data with partially repeated bits of the FEC code word. In this way an increase in the effective SNR can be achieved.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWING

A more complete appreciation of the disclosure and many of the attendant advantages thereof will be readily obtained as the same becomes better understood by reference to the following detailed description when considered in connection with the accompanying drawings, wherein:

FIG. 16 shows several embodiments of repeating different parts of a code word to obtain a final FEC code word as shown in FIG. 15.

DETAILED DESCRIPTION OF THE EMBODIMENTS

First, an outline of a new communication method for LPWA (Low Power Wide Area) communication to which the present technology is applied will be described. LPWA communication is a wireless communication capable of transmitting information in a wide range of several tens to 100 km with low power consumption for use e.g. in IoT devices for transmitting a small amount of information such as sensor information. In the new communication method, for example, a wireless signal is transmitted in the unlicensed 868 or 920 MHz band. In this case, it can be said that the new communication system is a kind of wireless communication in the 920 MHz band.

In Japan, the 920 MHz band is a frequency band released from July 2011 by the Ministry of Internal Affairs and Communications, and anyone can use it without a license. However, with regard to wireless communication in the 920 MHz band, the maximum continuous transmission time is limited to 4 seconds by the provision (Association of Radio Industries and Businesses, ARIB, (STD T-108)). Furthermore, if the continuous transmission time is shortened to, for example, 0.4 seconds or less, the influence of interference given to other systems using the same frequency band can be reduced. Therefore, in the ARIB regulation of the 920 MHz band, it is stipulated that more channels can be allocated by setting the continuous transmission time to 0.4 seconds or less. As a result, if it is set to 0.4 seconds or less, transmission and reception can be performed with less interference. If the continuous transmission time is further shortened to 0.2 seconds or less, the pause time can be shortened and retransmission can be performed. In the new communication method, for example, the same packet is transmitted a plurality of times in order to improve the S/N ratio (Signal to Noise ratio, SNR) of the reception signal on the reception side.

Figure 1:
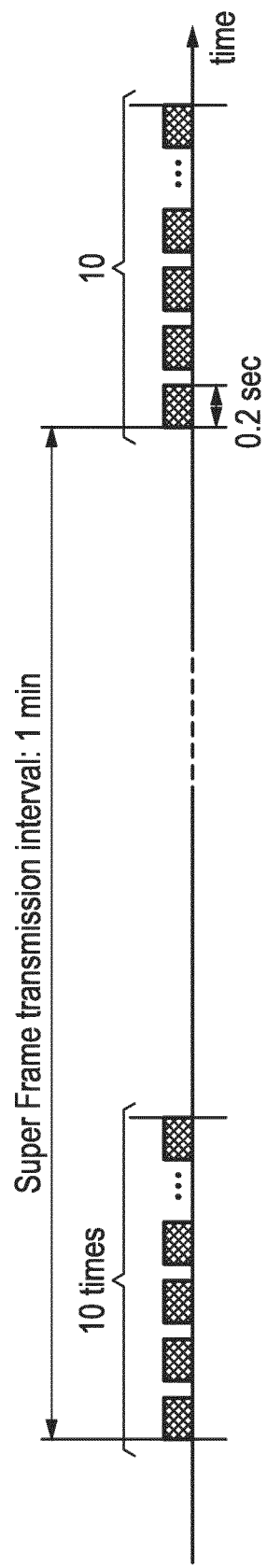
FIG. 1 is a diagram illustrating an example of transmitting the same packet a plurality of times in a new communication method.

FIG. 1 is a diagram showing an example of transmitting the same packet a plurality of times in the new communication method.

In FIG. 1, a 1 minute superframe (Superframe) is set, during which the same packet has been transmitted ten times. In the new communication method, the transmitting side carries out carrier sensing at the time of transmission. In the new communication method, for carrier sense, a superframe of one minute is set for ten packet transmissions, for example, as shown in FIG. 1.

Figure 2:
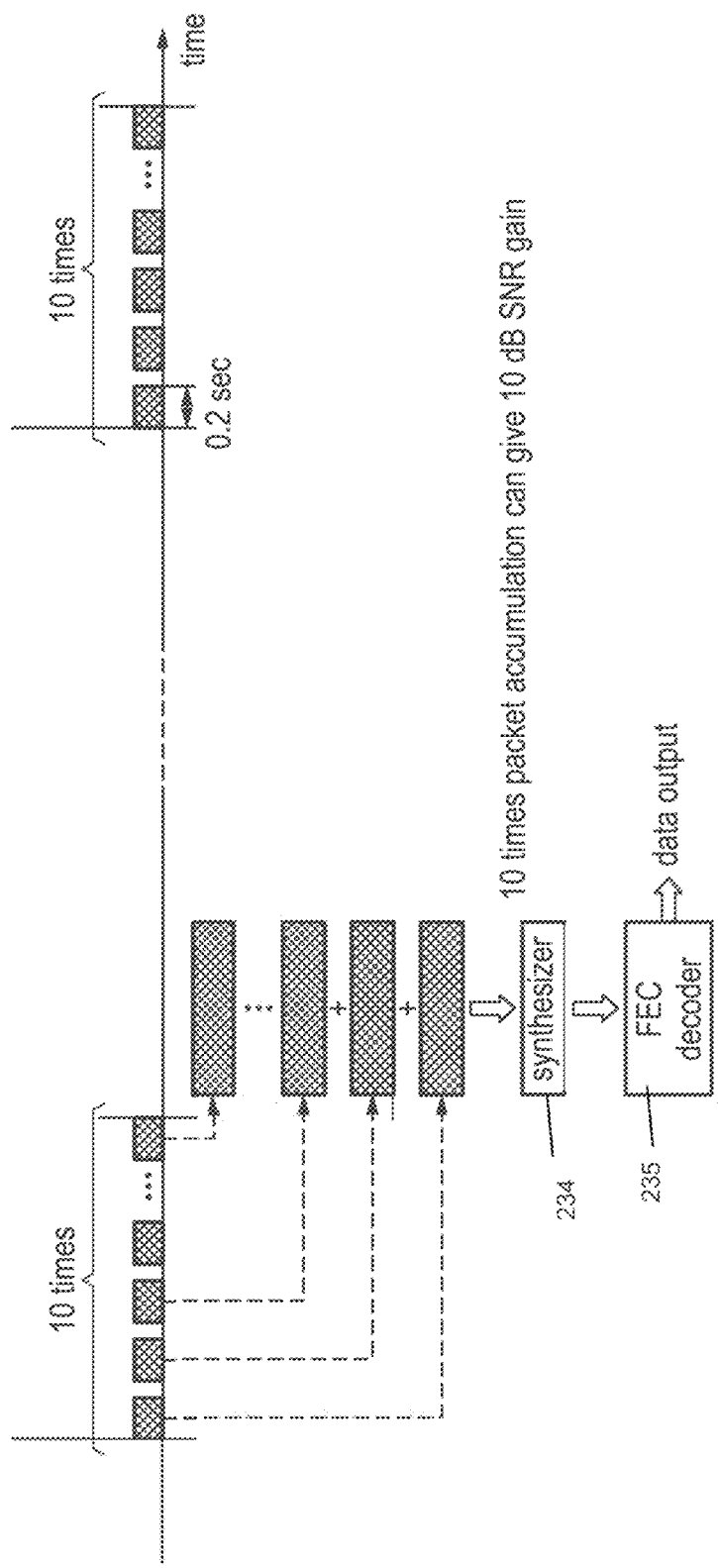
FIG. 2 is a diagram showing an example of reception of a packet on the receiving side in a new communication method.

FIG. 2 is a diagram showing an example of reception of a packet on the receiving side in the new communication method.

The receiving side receives up to ten packets from the transmitting side and synthesizes these (ten) packets using a synthesizer 234 as shown in FIG. 2 to generate a combined signal (If signal quality is not sufficiently good, the receiver might only find less than ten packets from the transmitting signal). Then, the receiving side extracts data from the synthesized signal and outputs it by carrying out decoding (error correction) etc. of the synthesized signal using a decoder 235. In this way, by synthesizing the packets to generate a combined signal, the S/N ratio can be improved. For example, if 10 packets can be added (synthesized), the S/N ratio can be improved by about 10 dB.

Therefore, in the new communication method, even if the S/N ratio of one packet is low, it is possible for the receiving side to acquire data, enabling longer distance information transmission. In addition, in the new communication method, by setting the packet transmission time to 0.2 seconds or less, or 0.4 seconds or less as described above, it is possible to use more frequency channels without being restricted by ARIB regulation. With the new communication method, for example, frequency hopping using a plurality of carrier frequencies can be performed.

Figure 3:
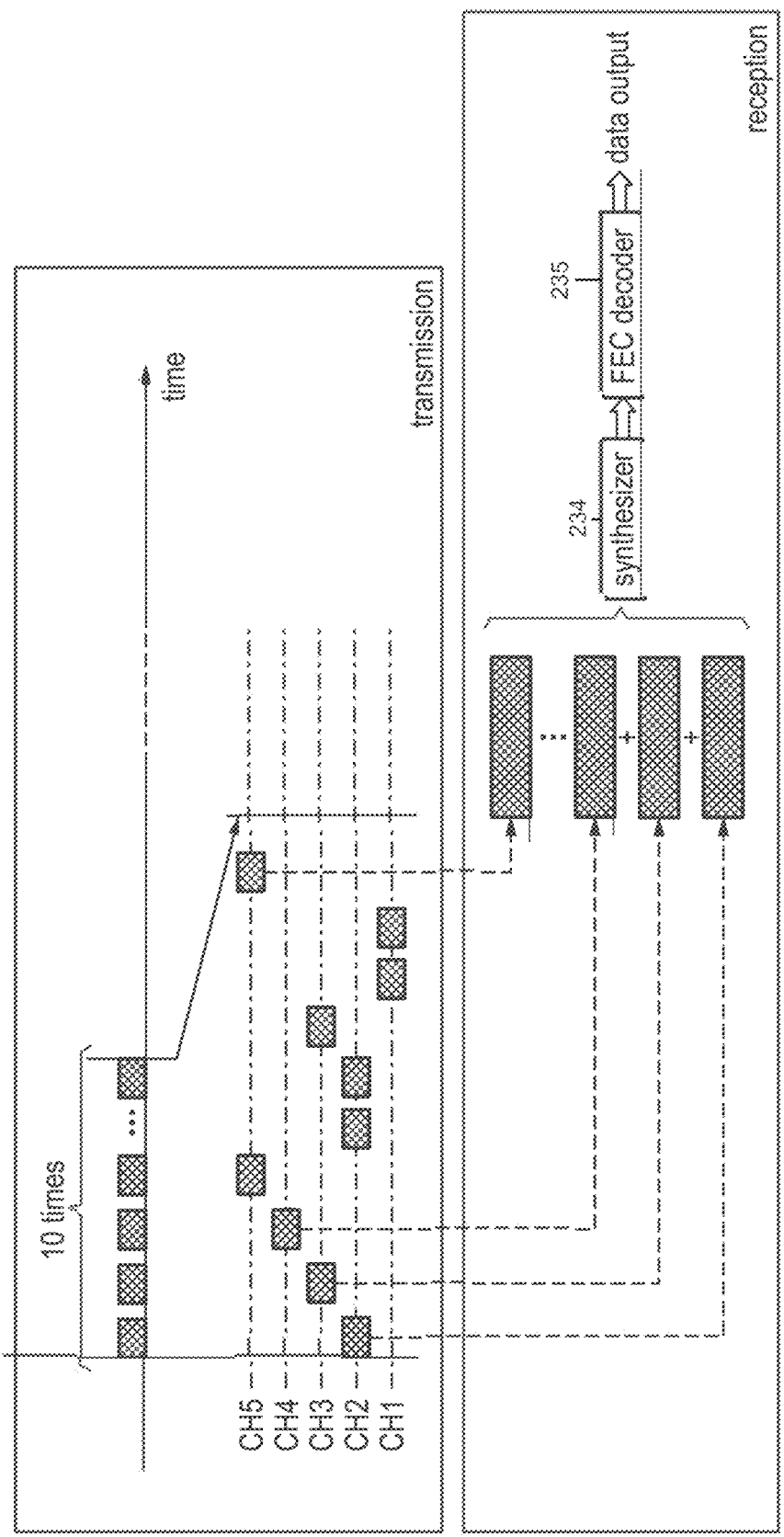
FIG. 3 is a diagram showing an example of frequency hopping.

FIG. 3 is a diagram showing an example of frequency hopping. Again, packets are to be synthesized using the synthesizer 234 and decoded using the decoder 235. In the frequency hopping of FIG. 3, five channels CH 1 to CH 5 are prepared, and each packet is selected by transmitting one of these five channels. As a channel selection method, a method of increasing the transmission channel number according to the transmission order, a method of determining the transmission channel number according to a predetermined mathematical expression, a method of randomly selecting the transmission channel number, or the like can be done. According to such frequency hopping, the occurrence of interference can be reduced.

Figure 4:
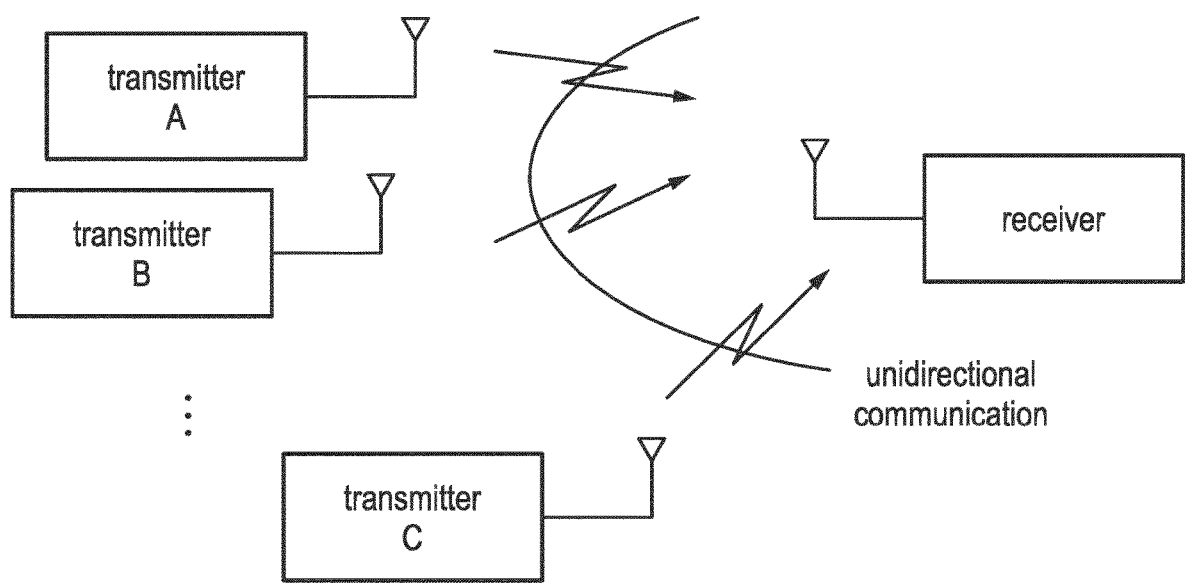
FIG. 4 is a diagram showing an example of a radio system in which interference can Occur.

FIG. 4 is a diagram showing an example of a radio system in which interference can occur. The radio system of FIG. 4 has a plurality of transmitters (transmitter A through transmitter C) and a receiver. In the wireless system of FIG. 4, a plurality of transmitters sometimes transmit radio signals at the same carrier frequency at the same time. When a plurality of transmitters transmits radio signals at the same carrier frequency at the same time, interference occurs in the receiver, and it becomes difficult to correctly receive the radio signals from each of the plurality of transmitters.

Therefore, the frequency hopping of FIG. 3 is applied to the radio system of FIG. 4. In this case, the possibility that the carrier frequencies become the same can be reduced, and the occurrence of interference can be suppressed correspondingly. However, since the wireless system of FIG. 4 is a one-way communication, even if frequency hopping is performed, there is a possibility that carrier frequencies of a plurality of transmitters may be the same so that interference is not completely generated It is difficult to do.

Figure 5:
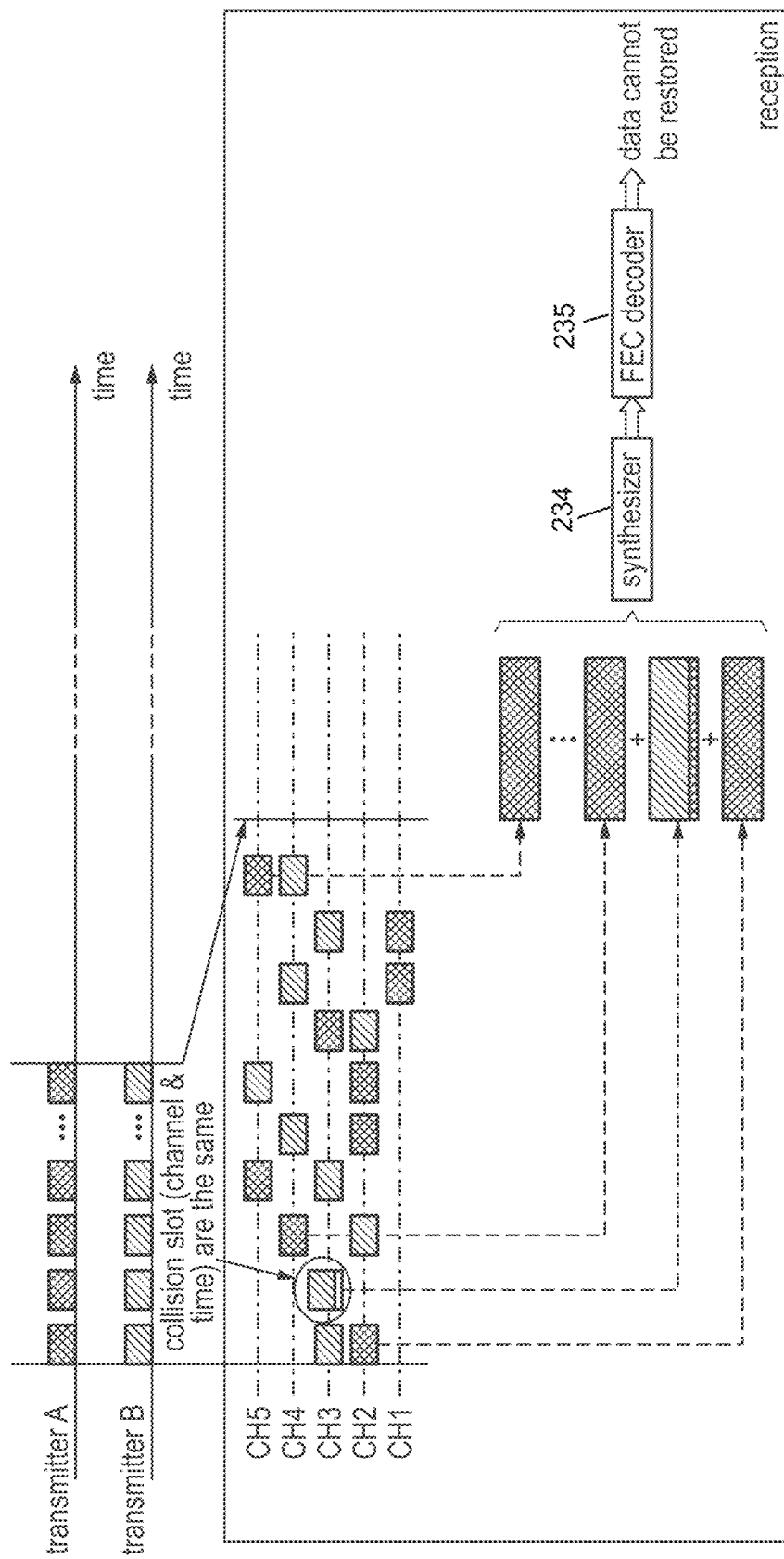
FIG. 5 is a diagram showing an example of interference occurring when frequency hopping is performed in a wireless system.

FIG. 5 is a diagram showing an example of interference occurring when frequency hopping is performed in the wireless system. Again, packets are to be synthesized using the synthesizer 234 and decoded using the decoder 235. In FIG. 5, frequency hopping is performed in the transmitters A and B. However, at a same time, when a certain packet transmitted from the transmitter A and a certain packet transmitted from the transmitter B have the same carrier frequency, the radio signals (packets) of transmitters A and B collide with each other. In this way, if collision of wireless signals occurs, it is not possible for the receiver to separate packets from different transmitters, and there is a possibility that an error will occur in data finally acquired.

For example, in FIG. 5, it is assumed that the receiver is receiving a radio signal from the transmitter A. Then, one packet among the packets transmitted from the transmitter A collides with the packet transmitted from the transmitter B, and the wireless signal transmitted from the transmitter B is transmitted from the transmitter A It is assumed that it is stronger than the radio signal. In this case, the receiver combines the collided packet of the transmitter B as a packet from the transmitter A. Therefore, there is a possibility that an error occurs in the synthesized signal and data cannot be extracted. In that case, there is a possibility that transmission and reception of 10 packets in the superframe are all wasted.

In bidirectional communication, it is possible to prompt retransmission, for example, by exchanging necessary information between each of the transmitters A and B and the receiver. However, in one-way communication, it is difficult to supply information from the receiving side to the transmitting side, so it is difficult to take countermeasures against packet collisions that can be done by bidirectional communication.

Figure 6:
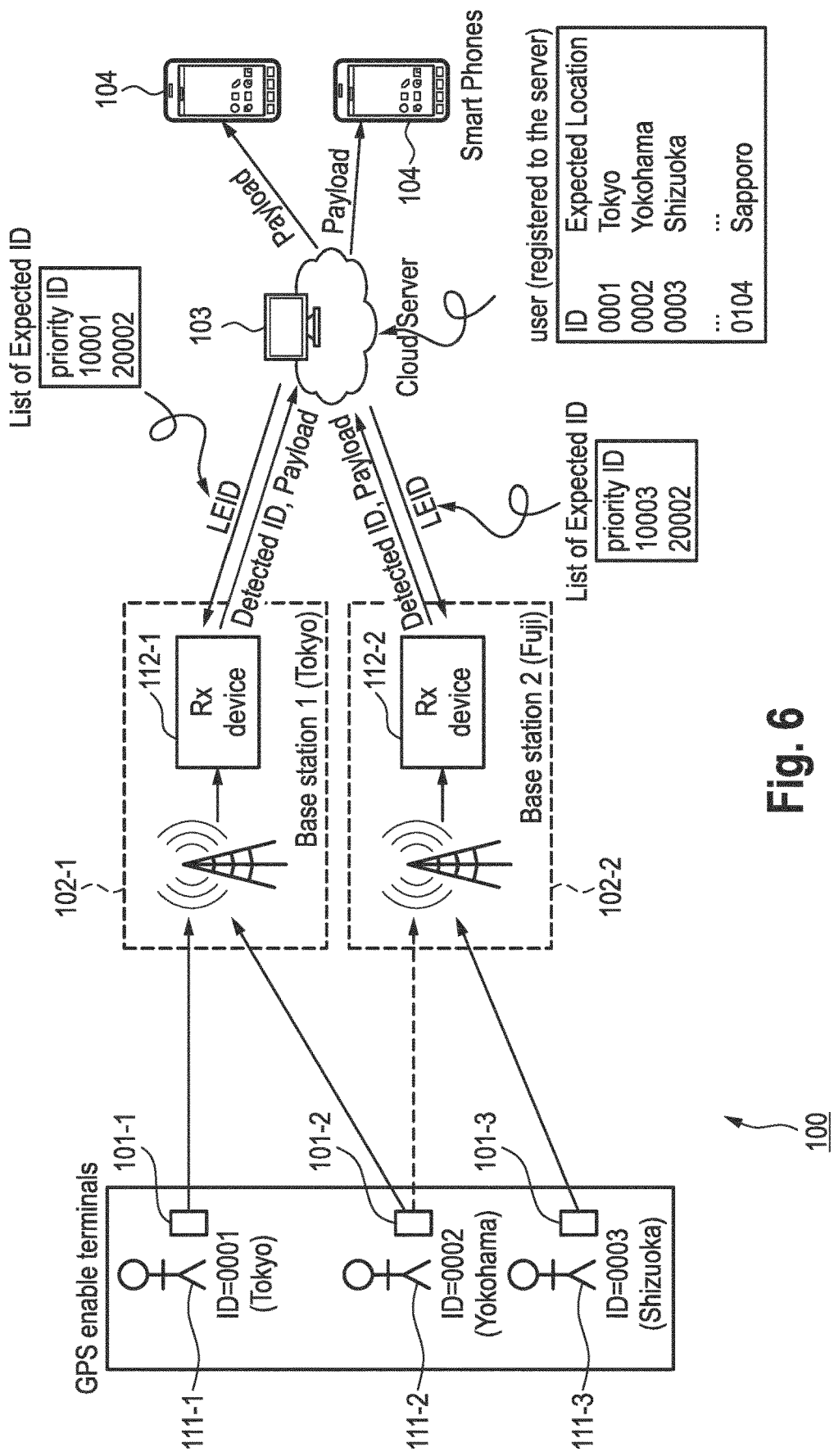
FIG. 6 is a diagram showing a configuration example of a position notification system which is an embodiment of a wireless system to which the present technology is applied.

FIG. 6 is a diagram showing a configuration example of a position notification system which is an embodiment of a wireless system to which the present technology is applied. The position notification system 100 of FIG. 6 includes transmission devices 101 (101-1 to 101-3), base stations 102 (102-1 and 102-2), a cloud server 103, and an information processing terminal 104. In the position notification system 100, a position monitoring service for monitoring the position of the transmitting apparatus 101 is provided by the transmitting apparatus 101 performing radio communication with the base station 102 by a new communication method.

The transmitting apparatus 101 is an embodiment of a transmitting apparatus to which the present technology is applied, and transmits position information indicating the position of itself as a radio signal. The base station 102 has a receiving device 112. The receiving apparatus 112 is one embodiment of a receiving apparatus to which the present technology is applied, receives the radio signal from the transmitting apparatus 101, acquires the position information of the transmitting apparatus 101, and transmits the position information and the like to the cloud server 103. Therefore, the base station 102 having the receiving device 112 functions as a relay station that relays the information transmitted from the transmitting device 101 and transmits it to the cloud server 103. The cloud server 103 manages various kinds of information such as the position information of each transmitting apparatus 101, and provides, for example, a service for notifying the user of the position of the transmitting apparatus 101. For example, the information processing terminal 104 operated by a user who wishes to know the position of the transmitting apparatus 101 accesses the cloud server 103, acquires the position information of the transmitting apparatus 101, displays it together with, for example, map data, etc., to the position of the transmission device 101.

The transmitting apparatus 101 carries the object to an object the user wants to monitor, for example, elderly persons or the like. The transmitting apparatus 101 has a position sensor that acquires its own position information using, for example, GNSS (Global Navigation Satellite System). That is, the transmitting apparatus 101 has, for example, a receiving mechanism for receiving a GPS signal from a GPS (Global Positioning System) satellite as a position sensor, and obtains its own position information (for example, latitude and longitude etc.) as appropriate. The transmitting apparatus 101 transmits location information as a radio signal as appropriate.

It should be noted that various types of sensors other than the position sensor are mounted on the transmission device 101, and the transmission device 101 can transmit the sensor information outputted by the sensor with a radio signal. For example, a sensor that senses biometric information such as a pulse and a heart rate, a sensor that senses temperature, humidity, etc., a sensor that detects opening and closing of a door, a door, etc., can be mounted on the transmitting device 101.

In FIG. 6, the transmitting apparatus 101-1 is carried by an elderly person 111-1 in Tokyo, the transmitting apparatus 101-2 is carried by an elderly person 111-2 of Yokohama. The transmitting apparatus 101-3 is carried by an elderly person 111-3 of Shizuoka. Further, the transmitting apparatus 101 has unique identification information (ID). For example, in FIG. 6, the identification information of the transmission device 101-1 is 0001 (ID=0001), the identification information of the transmission device 101-2 is 0002 (ID=0002), the identification information of the transmission device 101-3 is 0003 (ID=0003), respectively. The identification information of the transmission device 101 is registered in the cloud server 103.

The position monitoring target is arbitrary. For example, the object of monitoring the position may be a child, an animal such as a dog or a cat (pet), a company employee, or the like. Although three transmitting apparatuses 101 are shown in FIG. 6, the number of transmitting apparatuses 101 is arbitrary. The transmission device 101 may be configured as a dedicated device, but it may be incorporated in a portable information processing device such as a mobile phone or a smartphone, for example.

The base station 102 may be of any type. For example, the base station 102 may be a dedicated facility/building. Further, for example, the base station 102 may be installed in a roof of a building such as a general building, an apartment house, a house, a roof or the like. Further, for example, the base station 102 may be a portable equipment that can be carried by a user or installed in a mobile body such as a car.

A plurality of base stations 102 are installed. For example, in the case of FIG. 6, the base station 102-1 is set in Tokyo and the base station 102-2 is installed on mount Fuji. Although FIG. 6 shows two base stations 102, the number of base stations 102 is arbitrary.

The base station 102 has a receiving device 112. The receiving device 112 receives the radio signal from the transmitting device 101 and provides information (data) included in the radio signal to the cloud server 103. Further, the receiving apparatus 112 needs a parameter set (for example, a modulation rate of a wireless signal, on/off of frequency hopping, etc.) as wireless format information for determining a wireless format of wireless communication from the cloud server 103 to get information. The method by which the receiving device 112 acquires information from the cloud server 103 is arbitrary.

The configuration of the cloud server 103 is arbitrary, and may be constituted by an arbitrary number of servers and an arbitrary number of networks, for example. A plurality of cloud servers 103 may be provided.

In such a position notification system 100, the transmission device 101 performs frequency hopping setting based on its own identification information (ID). That is, the transmitting apparatus 101 sets the transmission timing and the transmission frequency of each packet based on the identification information and transmits each packet based on the setting. As described above, by performing transmission using frequency hopping, the occurrence of interference can be suppressed. That is, information can be more reliably transmitted.

Further, by setting the transmission timing and the transmission frequency based on the identification information, the transmission device 101 can change the pattern of the transmission timing and the transmission frequency for each transmitting apparatus 101. In this case, occurrence of collision between packets transmitted from different transmission apparatuses 101 can be suppressed. That is, information can be more reliably transmitted.

In addition, the receiving device 112 of the base station 102 acquires the identification information of the transmitting device 101 from the cloud server 103, and performs reception based on the identification information. That is, on the basis of the identification information, the reception device 112 sets reception timing and reception frequency in the same manner as the transmission timing and transmission frequency setting of the transmission device 101. If the transmission timing and the transmission frequency of the packet can be specified by the identification information of the transmission device 101 in the reception device 112, it suffices to detect the packet with respect to the transmission timing and the transmission frequency (that is, the reception timing and the reception frequency are changed So that it is easier to detect packets even when the S/N ratio is low. Therefore, reception with higher sensitivity becomes possible. That is, more reliable transmission of information can be realized. In addition, it is not necessary to perform processing such as packet detection in unnecessary timing and unnecessary frequency band, so it is possible to suppress an increase in load.

In addition, priority can be attached to the identification information of the transmission device 101. In the case where the priority is attached to the identification information of the transmission device 101 acquired from the cloud server 103, the reception device 112 selects, in accordance with the priority of the identification information, the radio wave from the transmission device 101 identified by the identification information It is possible to receive a signal (packet). In this case, more reliable transmission of information can be realized.

It is to be noted that the receiving device 112 transmits information on the reception of the radio signal, for example, when and when the radio signal from the transmitting device 101 is received, the content of the radio signal (data extracted from the radio signal) to the server 103.

The cloud server 103 preliminarily registers and manages information (also referred to as terminal information) about the transmitting device 101 and information about the user (also called subscriber information). The terminal information may include, for example, identification information of the transmission device 101, information of transmission frequency, main location, and the like. Further, the subscriber information can include, for example, the name, age, gender, address, payment information of the user (person receiving the position notification service), identification information of the transmitting apparatus to be used, login ID, password, and the like. Of course, the terminal information and the subscriber information may each include any information, and the present invention is not limited to the above example.

Further, the cloud server 103 transmits the identification information of the transmitting apparatus 101 to the receiving apparatuses 112 of the base stations 102 (some or all of the base stations 102) at a predetermined timing or in response to a request from the receiving apparatus 112 or the like. At that time, the cloud server 103 can supply the base station 102 with the identification information of the transmitting device 101, which is highly likely to receive the radio signal by the base station 102. In other words, the cloud server 103 cannot supply the base station 102 with the identification information of the transmitting apparatus 101, which is less likely to receive the radio signal by the base station 102. By doing so, it is possible to reduce the detection of unnecessary packets in the receiving apparatus 112 of the base station 102, and it is possible to suppress an increase in the load.

Also, as the number of transmitting apparatuses 101 to be received by the base station 102 increases, the probability that packet collision occurs increases accordingly. More precisely, since there is a low possibility that a packet will arrive from the transmitting device 101, which is unlikely to receive a radio signal, the probability that packet collision will actually occur will not be high. However, in setting the reception timing and the reception frequency performed in the base station 102, the probability that packet collision occurs increases as the number of target transmission apparatuses 101 increases. As described above, when packet collision occurs in the setting of the reception timing and the reception frequency, the reception of the packet is omitted. Therefore, if the receiving apparatus targets the transmitting apparatus 101, which is less likely to receive a radio signal, the receiving sensitivity unnecessarily decreases, and the reliability of information transmission may unnecessarily be reduced. As described above, the cloud server 103 does not supply the identification information of the transmission device 101, the possibility of which the base station 102 is less likely to receive the radio signal, so that the base station 102 transmits such a transmission device 101 as a reception target. In this case, it is possible to suppress the reduction in the reception sensitivity and achieve more reliable information transmission.

Further, the cloud server 103 acquires reception information obtained by receiving the radio signal from the reception device 112 of the base station 102. Based on the received information, for example, the cloud server 103 records the history of transmission/reception of information between the transmission device 101 and the reception device 112 (for example, the radio signal transmitted from which transmission device 101 is transmitted to the base station 102 When the receiving device 112 received it, etc.). Based on this history, the cloud server 103 selects the transmission device 101 that supplies the identification information to the base station 102, and in accordance with the selection result, the cloud server 103 transmits the identification information (LEID (List of Expected ID)) and supplies it to the receiving device 112 of the station 102. In this way, by supplying the identification information of the transmission device 101 to the reception device 112 of each base station 102 based on the past communication history, the reception device 112 of each base station 102 transmits the radio signal of each transmission device 101 can be more accurately determined. Therefore, each base station 102 can realize more reliable transmission of information.

Further, the cloud server 103 can provide, for example, the position of the transmission device 101 (elderly person 111) to the information processing terminal 104 based on the reception information from the reception device 112.

It should be noted that the identification information of the transmission device 101 may be supplied from the cloud server 103 to the base station 102 in any form. For example, the cloud server 103 may supply the identification information of the transmission device 101 to the base station 102 as a priority list. This priority list is information including a list of identification information of the transmission device 101 which is highly likely to receive a radio signal by the base station 102 to which the priority list is supplied. For example, the cloud server 103 generates and supplies a priority list for the base station 102 to each base station 102, and the base station 102 that has been supplied with the priority list transmits a transmission in which identification information is indicated in the priority list. Processing may be performed so as to receive a radio signal from the apparatus 101. In addition, the reception priority of the base station 102 may be added to the identification information of the transmission device 101 supplied to the base station 102. For example, the above priority list may include the priority of each identification information. Then, the base station 102 supplied with the priority list may set the priority order of signal reception, etc. based on the priority included in the priority list. By doing so, the cloud server 103 can not only control the transmitting apparatus 101 that the base station 102 receives the radio signal, but also can control the priority order of the reception. It is also possible to obtain the communication distance from the difference between the position where the base station 102 exists and the position information transmitted by the transmission device 101 and change the priority according to this communication distance.

Figure 7:
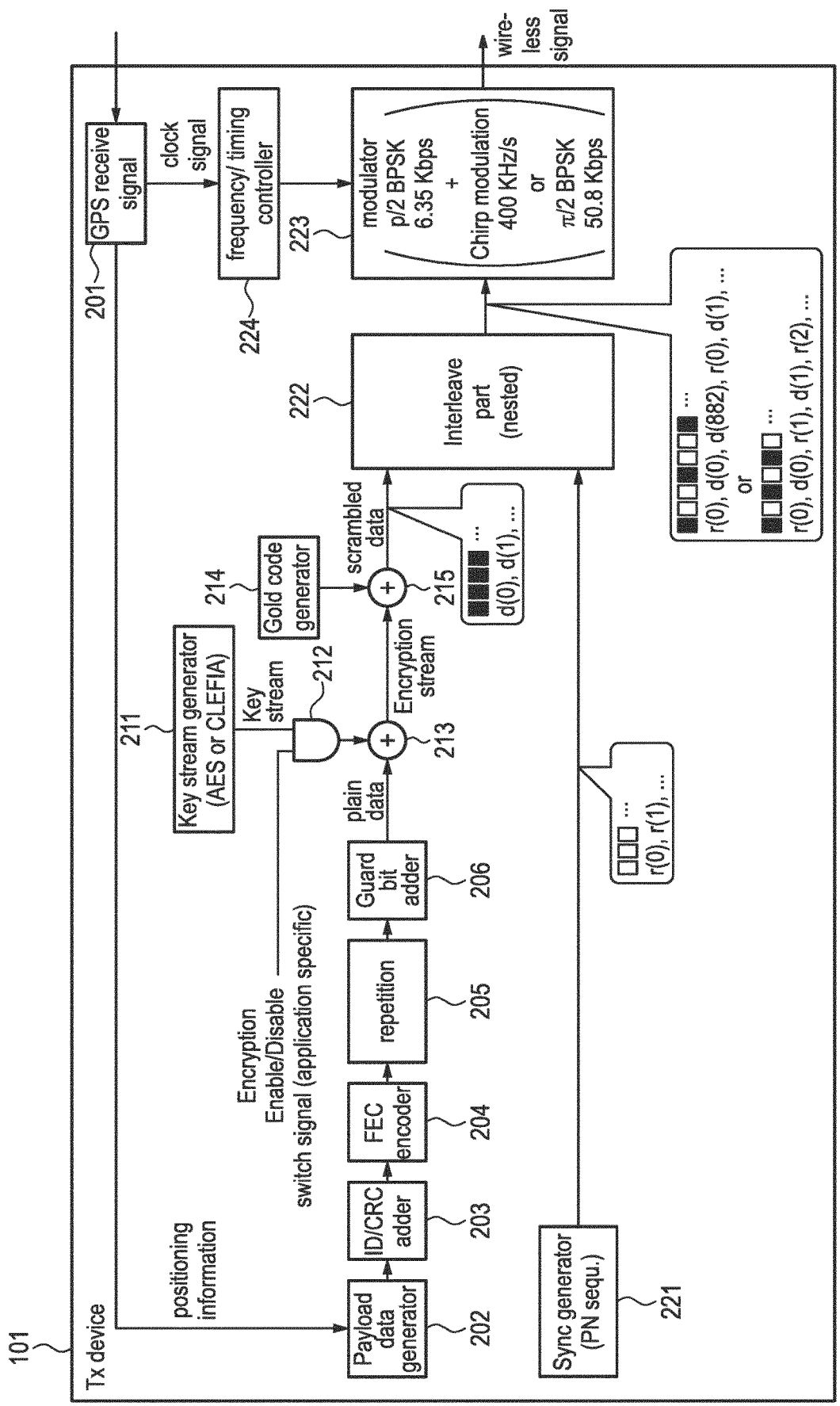
FIG. 7 is a block diagram showing a configuration example of a transmission device 101.

FIG. 7 is a block diagram showing a configuration example of the transmission apparatus 101. The transmitting apparatus 101 includes a GPS signal receiving section 201, a payload data generating section 202, an ID/CRC adding section 203, an FEC processing section 204, a repeating section 205, a guard bit adding section 206, a key stream generating section 211, an AND gate 212, an EXOR A gate 213, a Gold code generation unit 214, an EXOR gate 215, a sync generation unit 221, an interleave unit 222, a modulation unit 223, and a frequency/timing control unit 224. In some embodiments only single or a selected number of the elements 206-224 may be provided and may be commonly referred to as transmission section.

The GPS signal receiving unit 201 receives the GPS signal, acquires a 1 PPS (pulse/second) signal and the current time (GPS time) included in the GPS signal, and supplies it to the frequency/timing control unit 224 as a clock signal. In addition, the GPS signal receiving unit 201 acquires the position information (latitude, longitude, altitude) of the transmitting apparatus 101 from the GPS signal and supplies the position to the payload data generating unit 202 as the sensed sensor information.

The payload data generation unit 202 generates payload data to be a payload of the radio signal from position information serving as sensor information from the GPS signal reception unit 201, and supplies the payload data to the ID/CRC attachment unit 203. Note that the information to be the payload data is not limited to the position information and further the sensor information. The information to be the payload data can be decided according to, for example, an application to which the wireless system is applied or the like. However, the new communication method is a kind of a new communication method for LPWA communication which can transmit information in a wide range of several 10 to 100 km with low power consumption, and the size of the information serving as the payload data is suitable for LPWA communication It is desirable to have a size.

The ID/CRC attachment unit 203 adds an ID (identification information) of the transmission device 101 and a CRC (Cyclic Redundancy Check) code to the payload data from the payload data generation unit 202 to thereby perform FEC (Forward Error Correction) generates an FEC target unit to be processed, and supplies it to the FEC processing unit 204.

The ID/CRC attachment unit 203 generates a CRC code for payload data or payload data and ID.

The FEC processing unit (also called FEC encoder) 204 performs FEC processing on the FEC target unit from the ID/CRC attaching unit 203, and supplies the FEC frame obtained as a result to the repeating unit 205. That is, the FEC processing unit 204 performs error correction coding of the FEC target unit as FEC processing of the FEC target unit, and supplies the error correction code obtained by the error correction coding to the repeating unit 205. Specifically, in an embodiment the FEC processing unit 204 performs, for example, LDPC encoding of the FEC target unit and supplies the LDPC code obtained by the LDPC encoding to the repeating unit 205. It should be noted that the error correction code is not limited to the LDPC code. As the error correction code, for example, a convolutional code, a turbo code, or the like can be adopted.

The repeating unit 205 (also called frame forming section or including a frame forming section) generates a repeating unit in which the LDPC codes from the FEC processing unit 204 are repetitively arranged, and supplies it to the guard bit adding unit 206. The repeating unit 205 employs aspects of the present disclosure and will be explained in more detail below.

The guard bit adding section 206 adds (inserts) a guard bit to the repeating unit from the repeating unit 205 and supplies it to the EXOR gate 213.

The key stream generating unit 211 generates a key stream to be used for encryption and supplies it to the AND gate 212. In addition to the key stream from the keystream generating unit 211, a switching signal for switching the validity/invalidity of encryption in the EXOR gate 213 is supplied to the AND gate 212.

The switching signal is, for example, a logical 1 (for example, High level) in the case of encryption being enabled, and a logical 0 (for example, Low level) in the case of invalidating the encryption. The switching signal can be set, for example, according to the application. The switching signal can be set so that the whole of the repeating unit supplied from the guard bit adding unit 206 to the EXOR gate 213 or a part of the repeating unit is validly encrypted. Further, the switching signal can be set so that the entire encryption of the repeating unit supplied from the guard bit adding unit 206 to the EXOR gate 213 is invalidated.

The AND gate 212 calculates the logical product of the switching signal and the key stream from the keystream generating unit 211, and supplies it to the EXOR gate 213. As a result, the key stream is supplied from the AND gate 212 to the EXOR gate 213 only during the period in which encryption is effective in the switching signal.

The EXOR gate 213 encrypts the repeating unit with the stream cipher (method) by computing the exclusive OR of the repeating unit from the card bit adding section 206 and the key stream from the AND gate 212. The EXOR gate 213 supplies the encrypted repeating unit to the EXOR gate 215. Here, in the EXOR gate 213, the period during which the keystream from the AND gate 212 is supplied, that is, the period during which the switching signal is at logic 1 is encrypted. Therefore, in the EXOR gate 213, all or a part of the repeating unit may be encrypted, or the entire repeating unit may not be encrypted. For example, the Gold code generating unit 214 generates, for example, a Gold code as a scrambling sequence of the same size (number of bits) as that of the repeating unit from the EXOR gate 213, using two M sequence generators, and the EXOR gate 215. The EXOR gate 215 scrambles the repeating unit by computing the exclusive OR of the repeating unit from the EXOR gate 213 and the scrambling sequence from the Gold code generating unit 214, and supplies it to the interleaving unit 222.

The sync generation unit 221 generates a predetermined PN (Pseudo Noise) sequence such as M sequence, for example, as a synchronization signal, and supplies it to the interleave unit 222. It should be noted that the synchronization signal generated by the sync generation unit 221 is a known signal by the transmission device 101 and the reception device 112. Since the synchronization signal is known by the transmission device 101 and the reception device 112, the reception device 112 can perform synchronous detection of the radio signal from the transmission device 101, robust reception of the radio signal from the transmission device 101 can do. The initial value of the M sequence may be any value as long as it is a common value for transmission and reception. It is also possible to change the initial value of the M sequence according to the ID.

The interleave section 222 performs bit sequence d(0), d(1), . . . . As a repeating unit from the EXOR gate 213 and bit sequences r(0), r(1), . . . and interleaved sequences r(0), d(0), r(1), d(1), . . . , or r0 (0), d(0), d(832), r(1), d(1), . . . to the modulation section 223.

The modulation unit 223 performs modulation such as $\pi/2$ shift BPSK ($\pi/2$ Shift Binary Phase Shift Keying) modulation and chirp modulation using, for example, the interleave sequence supplied from the interleaving unit 222, For example, a 920 MHz band radio signal as a modulated signal obtained by the above-described method. Note that the modulation unit 223 transmits the radio signal at the transmission timing and the transmission frequency according to the control from the frequency/timing control unit 224.

The frequency/timing control unit 224 sets the transmission timing and the transmission frequency of the wireless signal transmitted by the modulation unit 223 according to the ID or the like of the transmission device 101, and transmits the wireless signal at the transmission timing and the transmission frequency, and controls the modulation section 223. The frequency/timing control unit 224 controls the modulation unit 223 in synchronization with the clock signal from the GPS signal reception unit 201. That is, in accordance with the clock signal from the GPS signal receiving unit 201, for example, the frequency/timing control unit 224 determines whether or not the current timing is a grid which is known (predetermined timing) in the transmission device 101 and the reception device 112. It recognizes whether it is timing (grid time), and controls the modulation unit 223 so that transmission of packets is started at grid timing.

Figure 8:
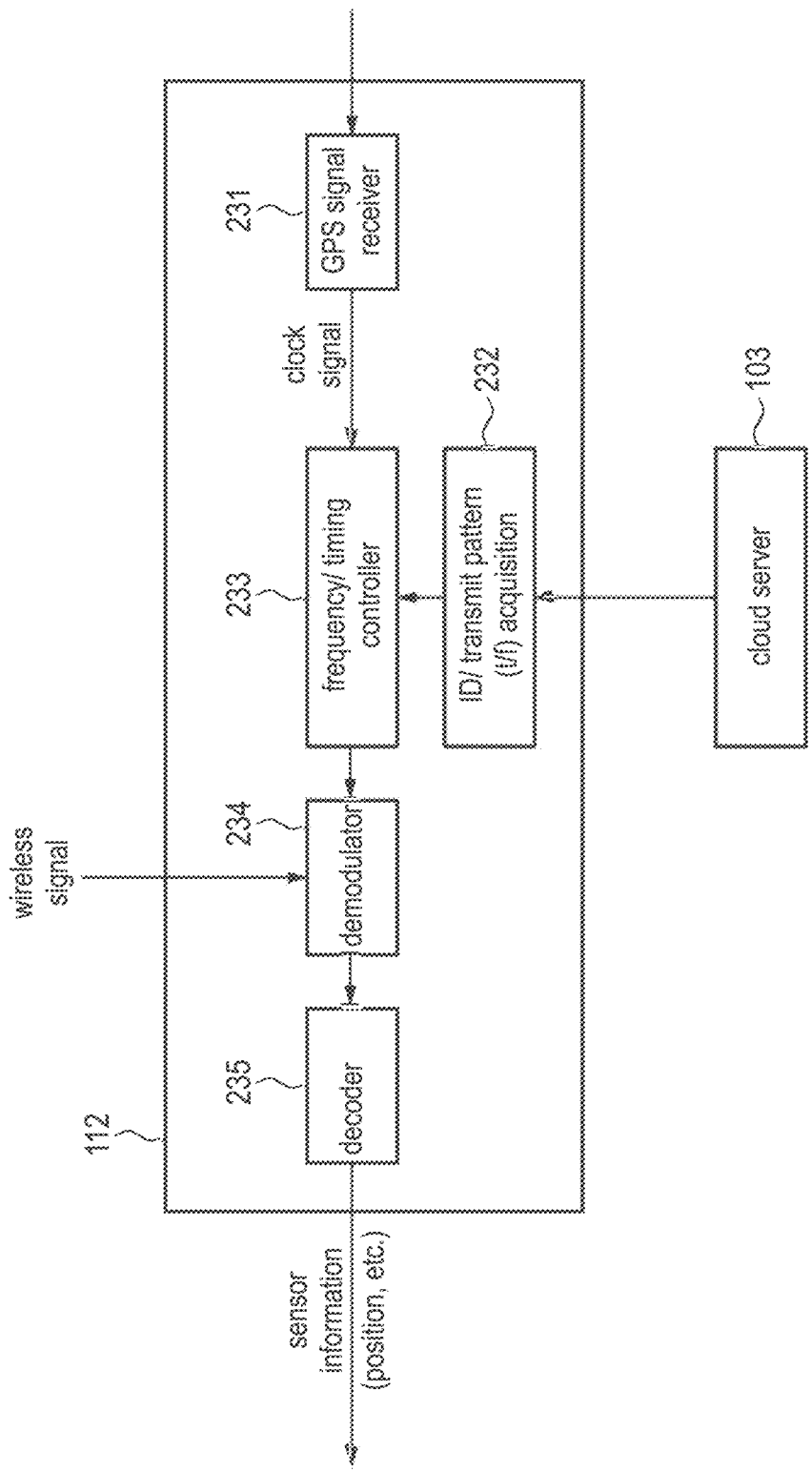
FIG. 8 is a block diagram showing a configuration example of a reception device 112.

FIG. 8 is a block diagram showing a configuration example of the reception device 112. The reception device 112 includes a GPS signal reception unit 231 (or generally a receiving section), an ID/transmission pattern acquisition unit 232, a frequency/timing control unit 233, the demodulator or a demodulation unit 234 (representing and/or including a frame extraction section), and the decoder or a decoding unit 235 (representing the FEC decoder).

The GPS signal receiving unit 231 receives the GPS signal, acquires 1 PPS signal and GPS time included in the GPS signal, and supplies it to the frequency/timing control unit 233 as a clock signal. For example, from the cloud server 103, the ID/transmission pattern acquiring unit 232 acquires a transmission pattern that is a pattern of the ID of the transmission device 101, the transmission timing, and the transmission frequency that the reception device 112 receives as a reception target of the radio signal from the timing control unit 233.

The frequency/timing control unit 233 sets the reception timing and the reception frequency of the radio signal in the demodulation unit 234 according to the transmission pattern from the ID/transmission pattern acquisition unit 232, and receives the radio signal at the reception timing and reception frequency so as to control the demodulation unit 234. As with the frequency timing control unit 224 in FIG. 7, the frequency/timing control unit 233 controls the demodulation unit 234 in synchronization with the clock signal from the GPS signal reception unit 231.

As described above, both of the transmission timing and the transmission frequency control of the modulation section 223 (FIG. 7) and the reception timing and the reception frequency control of the demodulation section 234 are controlled by the clock signal obtained from the GPS signal and By synchronizing with the time information, it is possible to precisely match the transmission timing and the transmission frequency of the modulation section 223 with the reception timing and reception frequency of the demodulation section 234.

The demodulation unit 234 receives the radio signal from the transmission device 101 at the reception timing and reception frequency according to the control of the frequency/timing control unit 233, performs FFT (Fast Fourier Transform) etc. of the radio signal and demodulates the radio signal. The demodulation unit 234 supplies the demodulation signal obtained by demodulating the radio signal to the decoding unit 235. In the demodulation of the decoding unit 234, for example, synchronous detection using a synchronization signal is performed, and the combination described in FIG. 2 is also performed.

The decoding unit 235 performs error correction by decoding the LDPC code included in the decoded signal from the demodulation unit 234 and outputs the sensor information included in the payload data obtained as a result. This sensor information is transmitted from the receiving device 112 to the cloud server 103.

Figure 9:
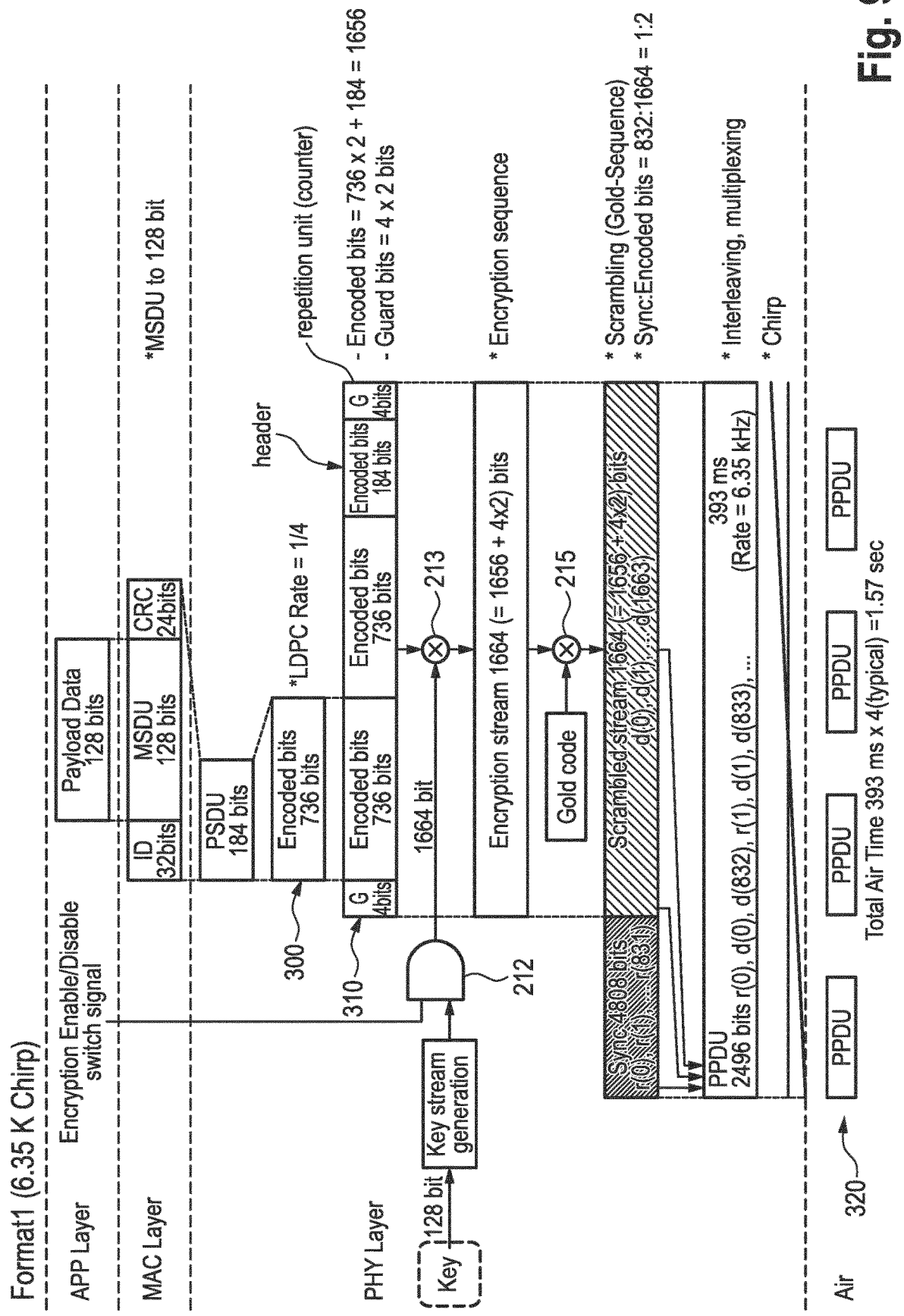
FIG. 9 is a diagram showing an example of a first format of data handled by a transmitting apparatus 101.

FIG. 9 is a diagram showing an example of a first format of data (signal) handled by the transmission apparatus 101. Here, in the new communication method, there are two modulation rates (transmission rates) of 6.35 kbps and 50.8 kbps, for example, which are performed in the modulation section 223. FIG. 9 shows the format of data when the modulation rate is 6.35 kbps out of 6.35 kbps and 50.8 kbps.

In the new communication method, three types of modes, i.e., MSDU Type-1, MSDU Type-2, and MSDU Type-3, are prepared as payload data setting modes, for example. The payload data is, for example, a 128-bit unit called MSDU (MAC (Media Access Control) Service Data Unit). In the case of MSDU Type-1, MSDU Type-2, MSDU Type-3, the actual data length is 128 bits, 64 bits, or 1 bit respectively. It is used for transmission of data (user data). That is, in MSDU Type-1, the payload data generation unit 202 uses 128-bit actual data (sensor information etc.) as it is to construct (generate) a 128-bit MSDU Service Data Unit. In MSDU Type-2, the payload data generation unit 202 pads 64-bit real data with 64 bits of 0 to form a 128-bit MSDU. In MSDU Type-3, the payload data generation unit 202 pads 1-bit actual data with 127 bits of 0 to form a 128-bit MSDU.

The MSDU Type depends on the application. E.g. transmission of localization data may require 128 bits (Type-1), while other sensors may only transmit less information. For binary senor data (on/off, true/false), one data bit is sufficient (Type-3), e.g., for early earthquake detectors. In general, the actual data length may be an arbitrary number smaller or equal than a predetermined maximum, e.g., up to 128 bits. The MSDU Type index is e.g. stored together with the device ID (userID) on a cloud server, so that the receiver knows about the actual data length.

In the 128-bit MSDU, the 32-bit ID of the transmitting apparatus 101 and the 24-bit CRC code are added in the ID/CRC attaching section 203, whereby PSDU (Physical Layer Service Unit) as the FEC target unit and it becomes a unit of 184 bits.

In the FEC processing unit 204, for example, the 184-bit PSDU is coded into an LDPC code having a code length N of 736 bits and a coding rate r of 1/4, resulting in 736 bits (=184×4/1) LDPC code (encoded bit).

In the first format where the modulation rate is 6.35 kbps, the LDPC code of 736 bits is repeated twice, and further, 184 bits of a part of the LDPC code of 736 bits are repeated to generate 1656 bits (=736 bits×2+184 bits) repeating unit. That is, in the first format, the repeat unit is configured by arranging a 736-bit LDPC code repeatedly twice and further arranging a part of 184 bits of the 736-bit LDPC code.

As the 184 bits of a part of the 736-bit LDPC code arranged in the repeating unit, for example, the first 184 bits of the 736-bit LDPC code can be adopted. Also, 184 bits of a part of the 736-bit LDPC code arranged in the repeat unit can be selected according to a predetermined optimization pattern. To the repeating unit, a guard bit is added (inserted) by the guard bit adding unit 206. That is, a 4-bit guard bit (G) is added to each of the head and the end of the repeating unit. By the addition of the guard bit, the repeating unit of 1656 bits becomes a repeating unit of 1664 bits (=1656 bits+4 bits×2). As the 4-bit guard bits, for example, all 0 bits can be adopted or a counter indicating the frame number, for example.

Here, in the FFT of the repeating unit performed in the demodulating unit 234 (FIG. 8) of the receiving apparatus 112, the signal quality at the end of the repeating unit is deteriorated. As a countermeasure against deterioration of the signal quality, guard bits are added to the head and the end of the repeating unit, respectively. For the repeating unit, the EXOR gate 213 calculates an exclusive OR with the keystream, whereby the repeating unit becomes an encrypted stream.

Here, when the setting mode of the payload data is MSDU Type-2 or MSDU Type-3, a part of the 128-bit MSDU as payload data is padded 0. Since MSDU Type-2 pads 64-bit real data with 64 bits of 0, half of the 128-bit MSDU is 0. In other words, half of the MSDU is meaningless information. In MSDU Type-3, since 1-bit real data is padded with 127 bits of 0, most of the 128-bit MSDU is meaningless information.

In the new communication method, in the case where there are many such meaningless information (in the case of MSDU Type 2 or MSDU Type 3), it is configured so that the wireless energy sent out to the communication path can be maximally and effectively utilized. That is, in the new communication method, data generated as padding 0 (part or all) cannot be encrypted. When padding 0 is not to be encrypted, the AND gate 212 is supplied with a switching signal for invalidating the encryption of the padding period 0 in the repeating unit. In response to the switching signal, the AND gate 212 supplies the key stream to the EXOR gate 213, whereby the EXOR gate 213 in the EXOR gate 213 generates a key stream in a period in which encryption is not ineffective, that is, a period in which encryption is valid. The repeat unit is encrypted using the key stream from the AND gate 212 as a target. In the portion where encryption is ineffective, padding 0 data is output as it is without being encrypted. It is known that the portion of the encryption invalidated in this way is data 0 in the receiving device 112.

Therefore, in the demodulation unit 234 of the reception apparatus 112, it is possible to improve the synchronization performance by treating the signal of the portion where the encryption is invalid as the synchronization signal. Likewise, in the demodulation section 235, the error correction performance can be improved by decoding the portion in which encryption is invalidated as known data "0". That is, by partially invalidating the encryption when the payload is short, the performance of the receiving device 112 is improved. By such performance improvement, it is possible to realize equivalent communication performance even with lower transmission antenna power, for example.

Like the repeating unit before encryption, the encrypted stream is composed of 1664 bits.

The 1664 bit encrypted stream is scrambled by exclusive OR with the gold code as the scrambling sequence by the EXOR gate 215, and becomes a scrambled stream. The scrambled stream is a 1664-bit bit sequence d(0), d(1), . . . , d(1663) similarly to the cipher stream before scrambling.

For the first format in which the modulation rate is 6.35 kbps, the sink generation unit 221 generates bit sequences r(0), r(1), . . . r(831) as 832-bit synchronization signals (Sync)). Therefore, for the first format with a modulation rate of 6.35 kbps, the ratio of the length of the sync signal to the length of the scrambled stream is 832:1664=1:2.

A bit series r(0), r(1), . . . r(831) as a synchronizing signal of 832 bits and bit series d(0), d(1), . . . as a 1664 bit scramble stream, d(1663) are interleaved in the interleave section 222. As a result, bit sequences r(0), d(0), d(832), r(1), d(0), d(0), d(0), d(2), and so on) as 2496 bits PPDU (Presentation Protocol Data Unit) (1), d(833) . . . are generated.

Here, bit sequences r(0), r(1), . . . , r(831) as 832-bit synchronization signals and bit sequences d(0), d(1) as 1664-, . . . , d(1663) are interleaved, for example, in accordance with the following C program. Note that PPDU (n) represents the (n+1) th bit from the head of the 2496 bit PPDU, and (n % x) represents the remainder obtained by dividing n by x. The symbol "==" means to judge whether the calculation result is equal or not. Also, in the division calculation (n/3 etc.) where n is a dividend, decimals below the decimal point are truncated:

```
For (n = 0; n <2496; n ++) {
    If ((n% 3) == 0) PPDU (n) = r (n / 3);
    If ((n% 3) == 1) PPDU (n) = d (n / 3);
    If ((n% 3) == 2) PPDU (n) = d (n / 3 + 1);
}
```

For the 2496-bit PPDU, π/2 shift BPSK modulation of 6.35 kbps is performed by the modulator 223, and chirp modulation of 400 kHz/s is further performed. Then, the 2496 bit PPDU is transmitted as a radio signal.

For a 2496 bit PPDU, when π/2 shift BPSK modulation at 6.35 kbps is applied, the transmission (transmission) time of the 2496 bit PPDU is about 393.2 ms. It is a transmission of 0.4 seconds or less and satisfies the ARIB regulation of the 920 MHz band.

For chirp modulation, for example, a frequency shift of about −78.6 kHz is given at the start of transmission of a PPDU with a transmission time of about 393.2 ms. With chirp modulation at 400 kHz/s, the frequency linearly changes at a change rate of 400 kHz/s, so the frequency shift at the end of transmission of the PPDU with a transmission time of approximately 393.2 ms is approximately +78.6 kHz. For example, when the frequency (center frequency) of the carrier is 925 MHz, the signal frequency of the radio signal changes linearly from 924.9214 MHz to 925.0786 MHz by chirp modulation. With this chirp modulation, even if a modulation rate of 6.35 Kbps is used, since frequency utilization efficiency improves, it becomes strong against interference and also it is possible to reduce the amount of calculation involved in synchronization detection due to the characteristics of chirp modulation.

For the first format, the transmitting apparatus 101 repeatedly transmits the PPDU as a packet, for example, four times. In this case, the time required for four transmissions of the PPDU is about 1.57 seconds (=393.2 ms×4).

In the present embodiment, one type of LDPC code having a code length N of 736 bits and a coding rate r of 1/4 is prepared as the LDPC code, while setting mode of the payload data is MSDU Type 1, MSDU Type-2, and MSDU Type-3, padding of 0 constitutes an 184-bit PSDU as an FEC target unit, LDPC encoding of the 184-bit PSDU is classified into one type LDPC codes for respective setting modes are prepared for each setting mode, for example, LDPC coding of real data in each setting mode is performed without padding of 0, can be performed using the LDPC code for the setting mode.

However, when preparing an LDPC code for each setting mode, it is necessary for the transmitting apparatus 101 to store the check matrix of the LDPC code for each setting mode, and in the LDPC encoding, processing such as switching matrices is required. On the other hand, when one type of LDPC code having a code length N of 736 bits and a coding rate r of 1/4 is used in the transmitting apparatus 101, as for the LDPC code, a check matrix of one type of LDPC code is stored and it is not necessary to switch the check matrix, so that it is possible to reduce the load and consequently reduce the power consumption.

Figure 10:
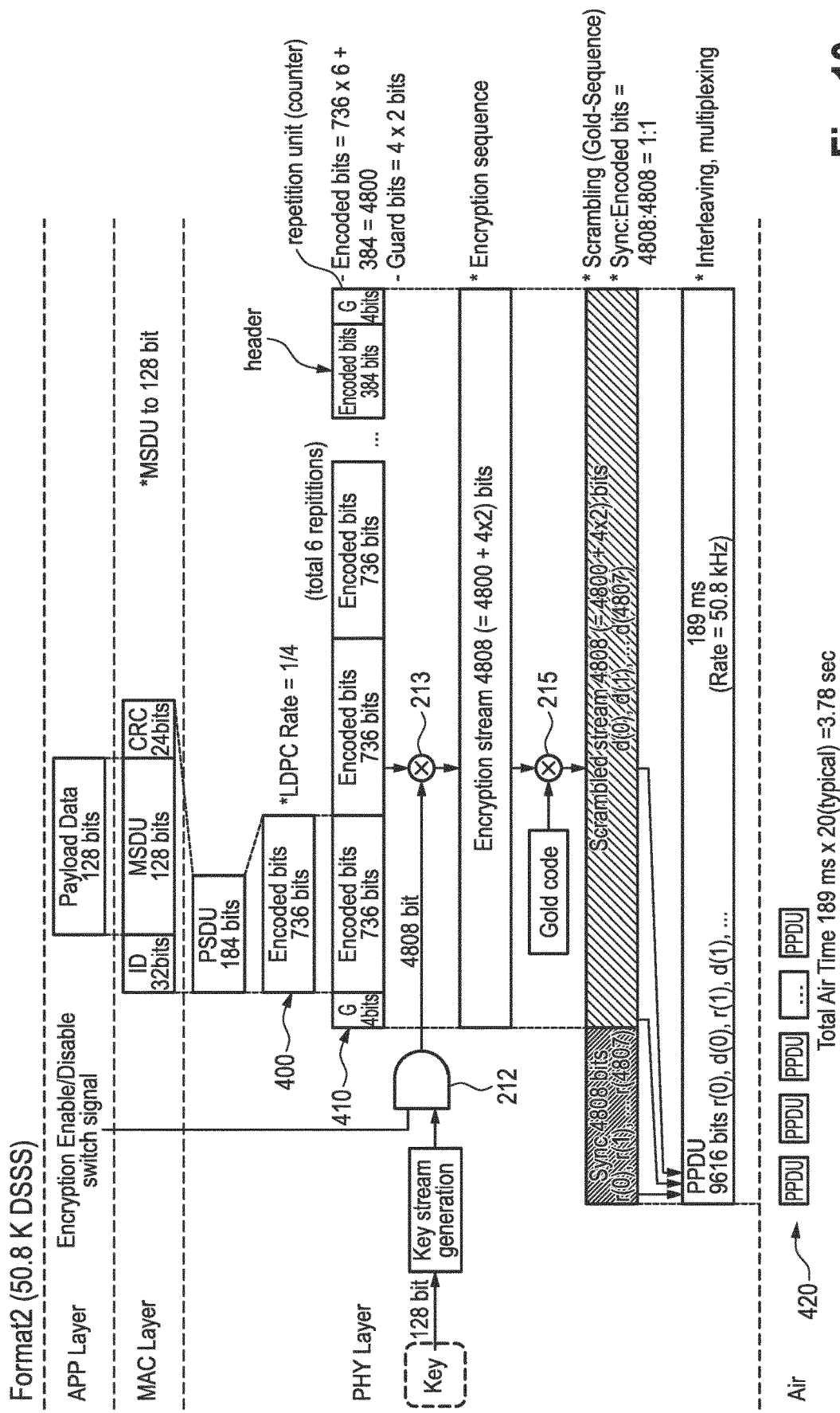
FIG. 10 is a diagram showing an example of a second format of data handled by a transmission device 101.

FIG. 10 is a diagram showing an example of a second format of data handled by the transmitting apparatus 101. That is, FIG. 10 shows the format of data when the modulation rate is 50.8 kbps out of 6.35 kbps and 50.8 kbps.

In the second format, the MSDU as the payload data, the PSDU as the FEC target unit, and the LDPC encoding are the same as in the case of the first format (FIG. 9), so the description is omitted. In the second format where the modulation rate is 50.8 kbps, the LDPC code of 736 bits is repeated six times and further 384 bits of the LDPC code of 736 bits are repeated so that 4800 bits (=736 bits×6+384 bits) repeating unit. That is, in the second format, the repeating unit is configured by arranging a 736-bit LDPC code repeatedly six times and further arranging 384 bits of a part of the 736-bit LDPC code.

As the 384 bits of a part of the 736-bit LDPC code arranged in the repeating unit, for example, the first 384 bits of the LDPC code of 736 bits can be adopted. Also, 384 bits of a part of the 736-bit LDPC code arranged in the repeat unit can be selected according to a predetermined optimization pattern, for example.

For the repeating unit, as in the case of the first format, a 4-bit guard bit (G) is added to the head and the end, respectively. By the addition of the guard bit, the repeating unit of 4800 bits becomes a repeating unit of 4808 bits (=4800 bits+4 bits×2). Thereafter, in the second format, as in the case of the first format, a 4808 bit repeating unit is encrypted to be an encrypted stream, further scrambled, and made into a scrambled stream. In the second format, the scrambled stream is a 4808 bit sequence of bits d(0), d(1), . . . , d(4807) of the same size as the repeating unit to which the guard bit is added.

As for the second format, the sink generation unit 221 generates bit sequences r(0), r(1), . . . r(0), . . . , r (0) as a 4808 bit synchronization signal (Sync) of the same size as the scramble stream 4087. Therefore, for the second format, the ratio of the length of the synchronizing signal to the length of the scrambled stream is 4808:4808=1:1.

A bit sequence r(0), r(1), . . . r(4087) as a 4808 bit synchronization signal and bit sequences d(0), d(1), . . . as a 4808 bit scramble stream, and d(4807) are interleaved by the interleave section 222. As a result, bit sequences r(0), d(0), r(1), d(1), and d(0) as PPDUs of 9616 bits (=4808 bits+4808 bits), in which bits as synchronization signals are periodically inserted, . . . are generated. Here, the bit series r(0), r(1), . . . , r(4807) as 4808 bit synchronization signals and the bit series d(0), d(1) as 4808 bit scramble streams, . . . , d(4807) are interleaved according to the following C program, for example:

```
For (n = 0; n <9616; n ++) {
    If ((n% 2) == 0) PPDU (n) = r (n / 2);
    If ((n% 2) == 1) PPDU (n) = d (n / 2);
}
```

For the 9616 bit PPDU, π/2 shift BPSK modulation of 50.8 kbps is performed by the modulating unit 223, and it is transmitted as a radio signal. When π/2 shift BPSK modulation of 50.8 kbps is applied to the 9616 bit PPDU, the transmission time of the 9616 bit PPDU is about 189.4 ms. Since it is less than the ARIB prescribed 0.2 seconds, it becomes possible to send it repeatedly a plurality of times with a short transmission pause time.

Regarding the second format, the transmitting apparatus 101 repeatedly transmits the PPDU as a packet, for example, 20 times. In this case, the time required for transmitting 20 PPDUs is about 3.78 seconds (=189.4 ms×20). In the second format, since the number of times of repetition is large, even if there is an influence such as fading, information can be more reliably transmitted.

Selection of the first format and the second format has different fading characteristics and the like required by the application, so it may be selected by the application.

Figure 11:
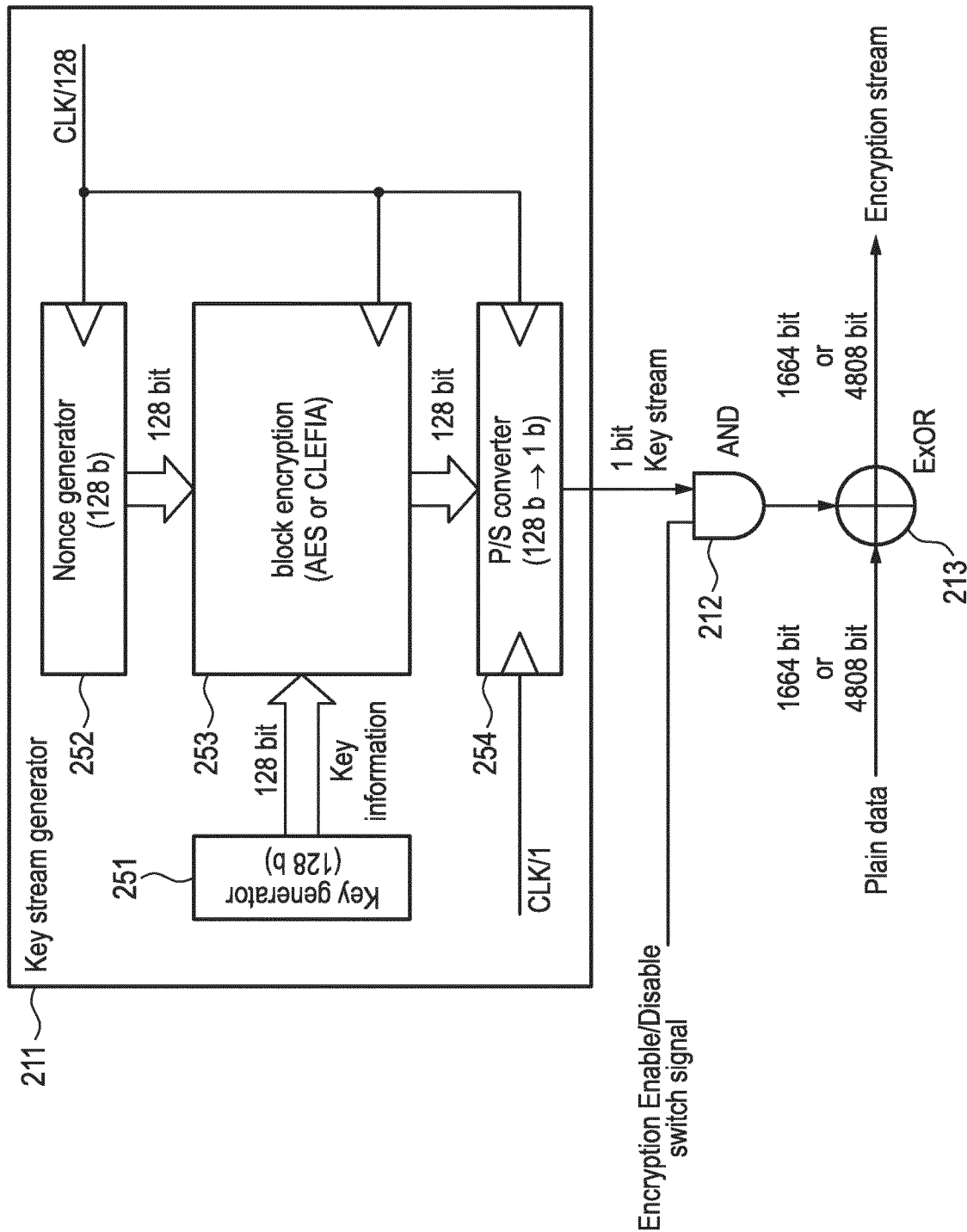
FIG. 11 is a block diagram showing a configuration example of a keystream generating unit 211.

In FIG. 11, the key stream generation unit 211 includes a key generation unit 251, a Nonce generation unit 252, a block encryption unit 253, and a P/S conversion unit 254. The key stream generating unit 211 generates a key stream used for encryption. For the first format, the key stream generating unit 211 generates a 1664 bit key stream, and for the second format, a 4808 bit key stream is generated.

The key generation unit 251 generates 128-bit key information. With regard to the key generation unit 251, the internal structure is made undisclosed, and the security of encryption is secured. Regarding the key generation unit 251, as long as the internal structure cannot be easily guessed, its configuration may be any configuration. For example, the key generation unit 251 may obtain (generate) key information by acquiring the GPS time from the GPS signal reception unit 201 (FIG. 7) and adding zero data so that the number of bits becomes 128 bits it can. The key generation unit 251 supplies the generated key information to the block encryption unit 253.

The Nonce generation unit 252 generates 128 bit Nonce (Number used ONCE). As for Nonce, it is expected that the value will be different each time the bit clock is divided by 128. For example, the Nonce generating unit 252 can be constituted by a 128-bit counter. In this case, for example, the Nonce generation unit 252 initializes the counter to a predetermined count value before starting the transmission of the wireless signal, and thereafter increments the count value by 1 at each timing when the bit clock is divided by 128 By doing so, Nonce can be generated. The Nonce generation unit 252 supplies the generated Nonce to the block encryption unit 253.

The block encryption unit 253 generates a 128-bit block cipher using the key information from the key generation unit 251 and Nonce from the Nonce generation unit 252, and supplies the block cipher to the P/S conversion unit 254. As the block cipher, for example, an AES (Advanced Encryption Standard) code, a CLEFIA code, or the like can be used.

The P/S converter 164 performs P/S (Parallel to Serial) conversion on the block cipher in units of 128 bits from the block encrypting unit 253 in units of 1 bit to generate a key stream in serial (1 bit unit) And supplies it to the AND gate 212. For the first format, the P/S converter 164 generates a 1664-bit key stream, and for the second format, it generates a 4808-bit key stream.

According to the present disclosure the FEC encoder 204 is configured to obtain (i.e. receive or retrieve) payload data structured as information words each having a first number of information bits and to encode information words having a predetermined second number of information bits into FEC code words each having a predetermined code word length. The frame forming section (represented by or included in the repeating unit 205) is configured to form frames from said from final FEC code words. A transmission stream 320, 420 may then be formed from a plurality of frames 310, 410 formed by said frame forming section. This will be explained in more detail in the following.

Figure 12A:
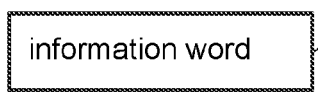
FIG. 12 shows an information word and an FEC code word.
Figure 12B:
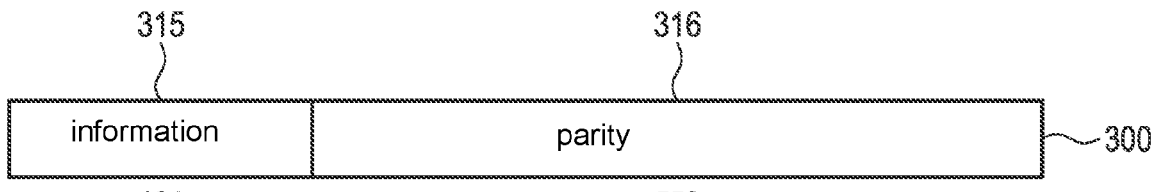

An information word 301 comprising a predetermined second number of information bits, in this example 184 information bits, is shown in FIG. 12A. The FEC encoder 204 is configured to encode such an information word 301, i.e. expects an information word having such a number (here 184) of information bits, to generate an FEC code word 300. In this exemplary embodiment the FEC code word 300 is a code word of a systematic code, in particular of an LDPC code, and comprises, as shown in FIG. 12B, an information portion 315 of e.g. 184 information bits and a parity portion 316 of e.g. 552 parity bits, totaling 736 code bits representing the predetermined code word length.

Figure 13:
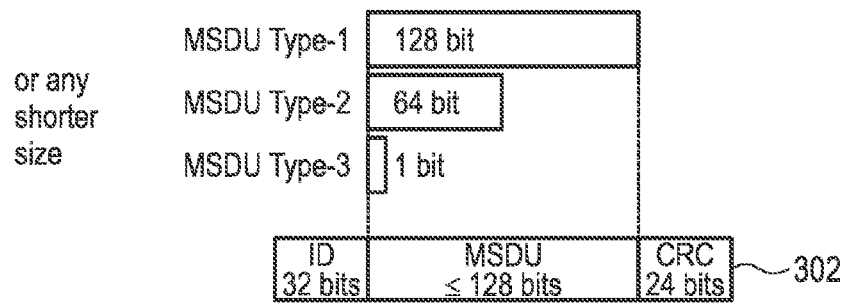
FIG. 13 shows the formation of an information word with a different number of information bits.

In practical scenarios an information word 302 used in a practical scenario may comprise less than the predetermined second number (here 184) of information bits, i.e. may generally have a first number of information bits less than the second number of information bits. This may e.g. the case if less information needs to be transmitted. Via a registration of the host ID, e.g. in an server, the receiver may know The information word 302 may e.g. comprise, as shown in FIG. 13 (and also for the MAC layer in FIG. 9 and FIG. 10), an ID portion (e.g. of 32 bits), an MSDU (MAC Service Data Unit, e.g. of 128 at maximum) and a CRC (cyclic redundancy check) portion (e.g. of 24 bits). The MSDU may comprise less than 128 bits, as provided for MSDU Type-1, e.g. 64 bits for MSDU Type-2 or 1 bit for MSDU Type-3. In this case the (total) first number of information bits of the information word 302 will be less than the second number (here 184), e.g. 120 information bits (for MSDU Type-2) or 57 information bits (for MSDU Type-3).

Figure 14:
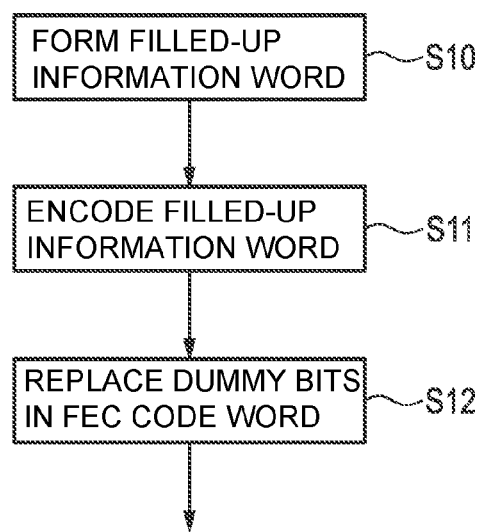
FIG. 14 shows a flowchart of the steps of the FEC encoder.
Figure 15A:
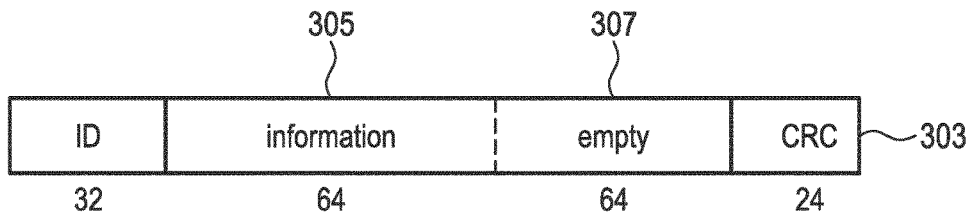
FIG. 15 illustrates the formation of a final FEC code word.
Figure 15B:
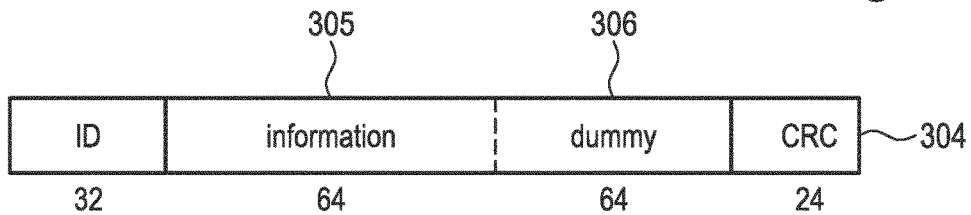

If the first number of information bits is smaller than the (predetermined) second number of information bits, e.g. in case of MSDU Type-2 the information word 303 comprises only 120 information bits rather than 184 information bits, the FEC encoder is configured to carry out the following steps as illustrated in FIG. 14 showing a flow chart of the steps and FIG. 15 illustrating the formation of a final FEC code word:

In a first step S10 a filled-up information word 304 is formed, as shown in FIG. 15B, by padding the first number (e.g. 64) of information bits 305 of the information word 303, as shown in FIG. 15A, with a third number (e.g. 64) of predetermined dummy bits 306, i.e. by filling the empty space 307 in the information word with dummy bits 306, so that the filled-up information word 304 has said second number (e.g. 184) of bits. The dummy bits can generally be any data, e.g. zeros or ones or a predetermined series of bits.

The position of information bits 305 of the information word 303 and the position of the empty space 307 can differ from FIG. 15. E.g., the order may be reverted, where the empty space comes before the information bits 305, or any interleaved sequence may be applied. In a preferred embodiment, where an irregular LDPC code is used as FEC code, in which the code bits have decreasing robustness levels (due to decreasing variable node degrees, which are commonly used in irregular LPDC code design), the order from FIG. 15 results in the lowest bit error rates after FEC decoding.

Figure 15C:
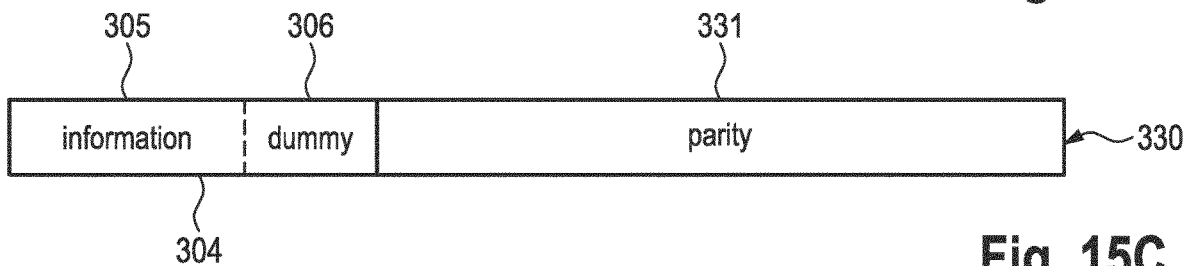

In a second step S11 said filled-up information word 304 is encoded into an FEC code word 330, as shown in FIG. 15C, comprising said filled-up information word 304 and a parity portion 331.

Figure 15D:
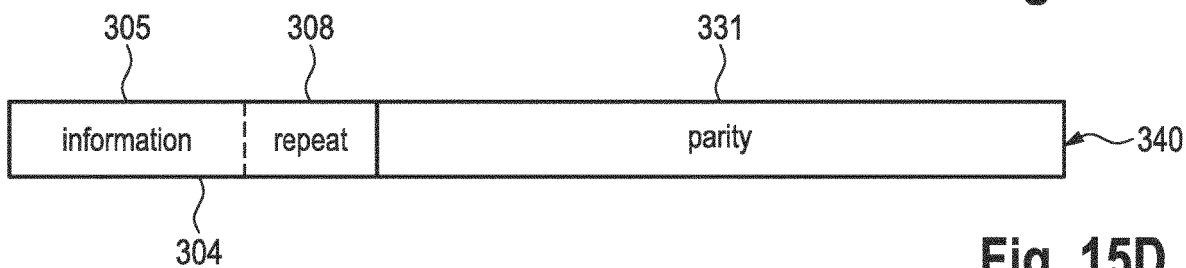

In a third step S12 a final FEC code word 340, as shown in FIG. 15D, is formed by replacing the dummy bits 306 of the filled-up information word 304 within the FEC code word 330 by repeat information 308 representing information bits and/or parity bits of said FEC code word 330, i.e. by bits from the information word 305 and/or the parity portion 331. The final FEC code word 340 is then used in the subsequent processing, in particular the frame forming and the forming of the transmission stream.

FIG. 16 shows various embodiments of a final code word 340 and various options which information bits and/or parity bits of said FEC code word 330 to include as repeat information 308.

According to a first pattern (called overwrite0) shown in FIG. 16A only information bits (payload), in particular the complete information portion 305 of 64 bits, are included as repeat information 308 in the final code word 340A. For Type-2, this results in duplicating the information bits. For Type-3, the one bit payload is repeated 128 times in total. For other payload lengths, various repetition patterns are possible, e.g., repeating the payload multiple times until the maximum length of 128 bits is achieved (the number of payload repetitions is not necessarily an integer number). This first pattern provides that the information bits are protected more strongly and is simple to implement.

According to a second pattern (called overwrite1) shown in FIG. 16B only parity bits, in particular for Type-2 MSDU the 64 least significant parity bits (defined as the rightmost bits of the bit sequence) 332 of the parity portion 331, are included as repeat information 308 in the final code word 340B. This provides that weak parities are protected more strongly and thus improves code convergence.

The FEC code can be an instance of a low-density parity-check (LDPC) code, with optimized degree spectrum to allow decoding at very low SNR. In a preferred embodiment, the LDPC code is systematic and uses a dual-diagonal line in the parity part of the parity-check matrix (i.e., systematic code, and parities will be accumulated). This results in parities having variable degree of 2 (only 2 outgoing edges, i.e., connections, to check nodes). This affects 551 parities out of 552 parity bits. The very last parity bit has only degree 1. The information bits, however, use larger degrees, e.g., degrees 10, 9, and—in part—3. The overall degree spectrum was subject to code optimization. It should be noted that code bits with small variable node degree collect only limited amount of information during message-passing decoding at FEC decoder. Thus, it is beneficial to repeat parities of the LDPC code word, since they have smaller variable node degree.

According to a third pattern (called overwrite2) shown in FIG. 16C only parity bits, in particular parity bits 333 evenly spread over the parity portion 331, are included as repeat information 308 in the final code word 340C. This provides that these parity bits 333 are protected more strongly.

According to a fourth pattern shown in FIG. 16D only parity bits, in particular parity bits 334 evenly spread over the parity portion 331 plus (if there is still room available for the repeat information 308) the last parity bits 335 (i.e. the least significant parity bits defined as the rightmost bits of the FEC code word), are included as repeat information 308 in the final code word. For Type-2 MSDU length of 64 bits, this results in repeating every $9^{th}$ parity bit (=ceil(552/64)=9), which will leave room for 3 more repetition bits (=64−floor(552/9)=3).

In further embodiments a mixture of e.g. evenly distributed information bits and parity bits may be included as repeat information 308 in the final code word.

A receiving apparatus according to the present disclosure generally comprises a frame extraction section configured to extract one or more frames from a received transmission stream, said frame being formed from a final FEC code word, and an FEC decoder configured to decode payload data from the final FEC code word, said payload data being structured as information words each having a first number of information bits, and to decode FEC code words each having a predetermined code word length into information words having a predetermined second number of information bits.

If the first number of information bits is smaller than the second number of information bits, the FEC decoder is configured to extract additional information bits and/or parity bits from a final FEC code word, wherein a final FEC code word comprises an information word and a parity portion, the information word comprising a first number of information bits and, if said first number is smaller than the second number of information bits, additional information bits and/or parity bits, to combine the additional information bits and/or parity bits with corresponding bits from the FEC code word, to form a filled-up information word by padding the first number of information bits of the information word of the final FEC code word with a third number of predetermined dummy bits so that the filled-up information word has said second number of bits, and to decode the payload data from the filled-up information word, the parity portion of the final FEC code word and the extracted additional information bits and/or parity bits.

With the disclosed apparatus and methods using repetitions of code bits in the final FEC code word an improvement of the SNR and coding gain can be achieved. The repeated code bits are, in addition to the (regular) code words, used by the FEC decoder by accumulating soft values of the decoded bits in order to increase the signal level and thus to improve the coding gain and SNR. After reading out the repeated code bits (which were used to overwrite the dummy bits according to the present disclosure) and accumulating their soft values to the soft values of the corresponding bits, which have been repeated, these bits are then replaced again by the predetermined dummy bits. Since these bits are perfectly known at the receiver side, their soft values can take on maximum reliability values, which further improves FEC decoding.

Thus, the foregoing discussion discloses and describes merely exemplary embodiments of the present disclosure. As will be understood by those skilled in the art, the present disclosure may be embodied in other specific forms without departing from the spirit or essential characteristics thereof. Accordingly, the disclosure of the present disclosure is intended to be illustrative, but not limiting of the scope of the disclosure, as well as other claims. The disclosure, including any readily discernible variants of the teachings herein, defines, in part, the scope of the foregoing claim terminology such that no inventive subject matter is dedicated to the public.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure. Further, such a software may also be distributed in other forms, such as via the Internet or other wired or wireless telecommunication systems.

The elements of the disclosed devices, apparatus and systems may be implemented by corresponding hardware and/or software elements, for instance appropriated circuits. A circuit is a structural assemblage of electronic components including conventional circuit elements, integrated circuits including application specific integrated circuits, standard integrated circuits, application specific standard products, and field programmable gate arrays. Further a circuit includes central processing units, graphics processing units, and microprocessors which are programmed or configured according to software code. A circuit does not include pure software, although a circuit includes the above-described hardware executing software.

It follows a list of further embodiments of the disclosed subject matter:

1. A transmission apparatus, in particular for use in a Low Throughput Network, said transmission apparatus comprising:
    an FEC encoder configured to obtain payload data structured as information words each having a first number of information bits and to encode information words having a predetermined second number of information bits into FEC code words each having a predetermined code word length, wherein the FEC encoder is configured, if the first number is smaller than the second number,
    to form a filled-up information word by padding the first number of information bits of an information word with a third number of predetermined dummy bits so that the filled-up information word has said second number of bits,
    to encode said filled-up information word into an FEC code word comprising said filled-up information word and a parity portion, and
    to form a final FEC code word by replacing the dummy bits of the filled-up information word within the FEC code word by information bits and/or parity bits of said FEC code word, and a frame forming section configured to form frames from said final FEC code words.

2. The transmission apparatus as defined in embodiment 1, wherein said FEC encoder is configured to replace the dummy bits of the filled-up information word within the FEC code word only by parity bits of said FEC code word.

3. The transmission apparatus as defined in embodiment 2, wherein said FEC encoder is configured to replace the dummy bits of the filled-up information word within the FEC code word by all parity bits or the least significant portion of the parity bits of said FEC code word.

4. The transmission apparatus as defined in embodiment 2, wherein said FEC encoder is configured to replace the dummy bits of the filled-up information word within the FEC code word by evenly spread parity bits of all parity bits of said FEC code word.

5. The transmission apparatus as defined in embodiment 1, wherein said FEC encoder is configured to replace the dummy bits of the filled-up information word within the FEC code word only by information bits of said FEC code word.

6. The transmission apparatus as defined in embodiment 5, wherein said FEC encoder is configured to replace the dummy bits of the filled-up information word within the FEC code word by all information bits or the leftmost or rightmost portion of the information bits of said FEC code word.

7. The transmission apparatus as defined in embodiment 1, wherein said FEC encoder is configured to replace the dummy bits of the filled-up information word within the FEC code word by evenly spread code bits of all code bits of said FEC code word.

8. The transmission apparatus as defined in any preceding embodiment, further comprising a transmission section configured to form a transmission stream from a plurality of frames formed by said frame forming section.

9. The transmission apparatus as defined in embodiment 8, wherein said transmission section comprises a modulation section configured to modulate the data contained in the frames using a chirp modulation or a direct-sequence spread spectrum modulation.

10. The transmission apparatus as defined in embodiment 8, wherein said transmission section comprises an encryption section for encrypting the data contained in the frames, a scrambling section for scrambling the data contained in the frames and/or an interleaving section for interleaving the data contained in the frames.

11. A transmission method, in particular for use in a low throughput network, said transmission method comprising:
    an FEC encoder configured to obtain payload data structured as information words each having a first number of information bits and to encode information words having a predetermined second number of information bits into FEC code words each having a predetermined code word length,
wherein the FEC encoder is configured, if the first number is smaller than the second number,
    to form a filled-up information word by padding the first number of information bits of an information word with a third number of predetermined dummy bits so that the filled-up information word has said second number of bits, to encode said filled-up information word into an FEC code word comprising said filled-up information word and a parity portion, and to form a final FEC code word by replacing the dummy bits of the filled-up information word within the FEC code word by information bits and/or parity bits of said FEC code word, a frame forming section configured to form frames from said final FEC code words.

12. A receiving apparatus, in particular for use in a low throughput network, said receiving apparatus comprising:

a frame extraction section configured to extract one or more frames from a received transmission stream, said frame being formed from a final FEC code word, and an FEC decoder configured to decode payload data from the final FEC code word, said payload data being structured as information words each having a first number of information bits, and to decode FEC code words each having a predetermined code word length into information words having a predetermined second number of information bits, wherein the FEC decoder is configured, if the first number of information bits is smaller than the second number of information bits, to extract additional information bits and/or parity bits from a final FEC code word, wherein a final FEC code word comprises an information word and a parity portion, the information word comprising a first number of information bits and, if said first number is smaller than the second number of information bits, additional information bits and/or parity bits, to combine the additional information bits and/or parity bits with corresponding bits from the FEC code word, to form a filled-up information word by padding the first number of information bits of the information word of the final FEC code word with a third number of predetermined dummy bits so that the filled-up information word has said second number of bits, and to decode the payload data from the filled-up information word, the parity portion of the final FEC code word and the extracted additional information bits and/or parity bits.

13. The receiving apparatus as defined in embodiment 12, further comprising a receiving section configured to receive a transmission stream formed from a plurality of frames, 14. A receiving method, in particular for use in a Low Throughput Network, said receiving method comprising:

extracting a frame from a received transmission stream, said frame being formed from a final FEC code word, and decoding payload data from the final FEC code word, said payload data being structured as information words each having a predetermined first number of information bits, and to decode FEC code words each having a predetermined code word length into information words having a second number of information bits, wherein the decoding includes, if the first number is smaller than the second number, to extract additional information bits and/or parity bits from a final FEC code word, wherein a final FEC code word comprises an information word and a parity portion, the information word comprising a first number of information bits and, if said first number is smaller than the second number of information bits, additional information bits and/or parity bits, to combine the additional information bits and/or parity bits with corresponding bits from the FEC code word, to form a filled-up information word by padding the first number of information bits of the information word of the final FEC code word with a third number of predetermined dummy bits so that the filled-up information word has said second number of bits, and to decode the payload data from the filled-up information word, the parity portion of the final FEC code word and the extracted additional information bits and/or parity bits.

15. A non-transitory computer-readable recording medium that stores therein a computer program product, which, when executed by a processor, causes the method according to embodiment 11 or 14 to be performed.

16. A computer program comprising program code means for causing a computer to perform the steps of said method according to embodiment 11 or 14 when said computer program is carried out on a computer.

The invention claimed is:

1. A transmission apparatus, said transmission apparatus comprising:

an FEC encoder configured to obtain payload data structured as information words each having a first number of information bits and to encode information words having a predetermined second number of information bits into FEC code words each having a predetermined code word length, wherein the FEC encoder is configured, if the first number is smaller than the second number, to form a filled-up information word by padding the first number of information bits of an information word with a third number of predetermined dummy bits so that the filled-up information word has said second number of bits, to encode said filled-up information word into an FEC code word comprising said filled-up information word and a parity portion, and to form a final FEC code word by replacing the dummy bits of the filled-up information word within the FEC code word by parity bits of said FEC code word, and frame forming circuitry configured to form frames from said final FEC code words; and a transmitter that transmits the frames from said final FEC code words.

2. The transmission apparatus as claimed in claim 1, wherein said FEC encoder is configured to replace the dummy bits of the filled-up information word within the FEC code word only by parity bits of said FEC code word.

3. The transmission apparatus as claimed in claim 1, wherein said FEC encoder is configured to replace the dummy bits of the filled-up information word within the FEC code word by all parity bits or the least significant portion of the parity bits of said FEC code word.

4. The transmission apparatus as claimed in claim 1, wherein said FEC encoder is configured to replace the dummy bits of the filled-up information word within the FEC code word by evenly spread parity bits of all parity bits of said FEC code word.

5. The transmission apparatus as claimed in claim 1, wherein said FEC encoder is configured to replace the dummy bits of the filled-up information word within the FEC code word by evenly spread code bits of all code bits of said FEC code word.

6. The transmission apparatus as claimed in claim 1, wherein said FEC encoder is an LDPC encoder.

7. A transmission method, said transmission method comprising:

obtaining payload data structured as information words each having a first number of information bits and to encode information words having a predetermined second number of information bits into FEC code words each having a predetermined code word length,
on condition that the first number is smaller than the second number,
  forming a filled-up information word by padding the first number of information bits of an information word with a third number of predetermined dummy bits so that the filled-up information word has said second number of bits,
  encoding said filled-up information word into an FEC code word including said filled-up information word and a parity portion,
  forming a final FEC code word by replacing the dummy bits of the filled-up information word within the FEC code word by parity bits of said FEC code word, and
  forming frames from said final FED code words, and transmitting, by a transmitter, frames from said final FEC code word.

8. A non-transitory computer-readable recording medium that stores therein a computer program product, which, when executed by a processor, causes the method according to claim 7 to be performed.

9. The transmission method as claimed in claim 7, wherein FEC code words are LDPC code words.

10. The transmission method as claimed in claim 7, wherein replacing the dummy bits of the filled-up information word within the FEC code word by only parity bits of said FEC code word.

11. The transmission method as claimed in claim 7, wherein
  replacing the dummy bits of the filled-up information word within the final FEC code word are all parity bits or the least significant portion of the parity bits of said FEC code word, or
  replacing the dummy bits of the filled-up information word within the final FEC code word are evenly spread parity bits of all parity bits of said FEC code word.

12. The transmission method as claimed in claim 7, wherein replacing the dummy bits of the filled-up information word within the FEC code word by evenly spreading code bits of all code bits of said FEC code word.

13. A receiving apparatus, said receiving apparatus comprising:
  a receiver to receive a transmission stream,
  a frame extraction circuitry configured to extract one or more frames from the received transmission stream, said one or more frames being formed from a final FEC code word, and
  an FEC decoder configured to decode payload data from the final FEC code word, said payload data being structured as information words each having a first number of information bits, and to decode FEC code words each having a predetermined code word length into information words having a predetermined second number of information bits,
  wherein the FEC decoder is configured, if the first number of information bits is smaller than the second number of information bits,
    to extract additional parity bits from a final FEC code word, wherein a final FEC code word comprises an information word and a parity portion, the information word comprising a first number of information bits and, if said first number is smaller than the second number of information bits, additional parity bits,
    to combine the additional parity bits with corresponding bits from the FEC code word,
    to form a filled-up information word by padding the first number of information bits of the information word of the final FEC code word with a third number of predetermined dummy bits so that the filled-up information word has said second number of bits, and
    to decode the payload data from the filled-up information word, the parity portion of the final FEC code word and the extracted additional parity bits.

14. The receiving apparatus as claimed in claim 13, wherein said FEC decoder is an LDPC decoder.

15. The receiving apparatus as claimed in claim 13, wherein additional bits in the final FEC code word are only parity bits.

16. The receiving apparatus as claimed in claim 13, wherein
  the additional parity bits of the filled-up information word within the FEC code word are all parity bits or the least significant portion of the parity bits of said FEC code word, or
  the additional parity bits of the filled-up information word within the FEC code word are evenly spread parity bits of all parity bits of said FEC code word.

17. The receiving apparatus as claimed in claim 13, wherein additional bits within the final FEC code word are evenly spread code bits of all code bits of said FEC code word.

18. A receiving method, said receiving method comprising:
  receiving, by a receiver, a transmission stream,
  extracting a frame from the received transmission stream, said frame being formed from a final FEC code word, and
  decoding payload data from the final FEC code word, said payload data being structured as information words each having a predetermined first number of information bits, and to decode FEC code words each having a predetermined code word length into information words having a second number of information bits,
  wherein the decoding includes, if the first number is smaller than the second number,
    extracting additional parity bits from a final FEC code word, wherein a final FEC code word comprises an information word and a parity portion, the information word comprising a first number of information bits and, if said first number is smaller than the second number of information bits, additional parity bits,
    combining the additional parity bits with corresponding bits from the FEC code word,
    forming a filled-up information word by padding the first number of information bits of the information word of the final FEC code word with a third number of predetermined dummy bits so that the filled-up information word has said second number of bits, and
    decoding the payload data from the filled-up information word, the parity portion of the final FEC code word and the extracted additional parity bits.

19. The receiving method as claimed in claim 18, wherein FEC code words are LDPC code words.

20. The receiving method as claimed in claim 18, wherein additional bits in the final FEC code word are only parity bits.

* * * * *